United States Patent
Kwon et al.

(10) Patent No.: US 11,411,063 B2
(45) Date of Patent: Aug. 9, 2022

(54) DISPLAY DEVICE FABRICATING METHOD

(71) Applicant: Samsung Display Co., LTD., Yongin-si (KR)

(72) Inventors: Myung-Seok Kwon, Namyangju-si (KR); Deok-Hwan Kim, Asan-si (KR); Jeong-Hyun Kim, Seongnam-si (KR); Hasook Kim, Hwaseong-si (KR); Joon ho Oh, Daejeon (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 392 days.

(21) Appl. No.: 16/776,034

(22) Filed: Jan. 29, 2020

(65) Prior Publication Data

US 2020/0343330 A1 Oct. 29, 2020

(30) Foreign Application Priority Data

Apr. 24, 2019 (KR) .......................... 10-2019-0047749

(51) Int. Cl.
| | | |
|---|---|---|
| *G02F 1/1362* | (2006.01) | |
| *H01L 27/32* | (2006.01) | |
| *H05K 5/00* | (2006.01) | |
| *H01L 51/56* | (2006.01) | |
| *H05K 3/36* | (2006.01) | |
| *G02F 1/13* | (2006.01) | |

(52) U.S. Cl.
CPC ........ *H01L 27/3276* (2013.01); *G02F 1/1303* (2013.01); *G02F 1/136286* (2013.01); *H01L 51/56* (2013.01); *H05K 3/361* (2013.01); *H05K 5/0069* (2013.01); *G02F 1/136295* (2021.01)

(58) Field of Classification Search
CPC .................................................. H01L 27/3276
See application file for complete search history.

(56) References Cited

FOREIGN PATENT DOCUMENTS

| | | | | |
|---|---|---|---|---|
| CN | 102785453 | * | 11/2012 | ............. B32B 37/10 |
| CN | 110213569 | * | 9/2019 | ............. H04N 17/00 |
| CN | 210638647 | * | 5/2020 | ............. G01B 11/00 |
| JP | 2006-011089 | | 1/2006 | |
| KR | 10-0815492 | | 3/2008 | |
| KR | 10-2008-0039770 | | 5/2008 | |
| KR | 10-0942479 | | 2/2010 | |
| KR | 10-2015-0061738 | | 6/2015 | |
| KR | 10-2016-0043190 | | 4/2016 | |
| KR | 10-2018-0073774 | | 7/2018 | |
| KR | 20180073774 | * | 7/2018 | ............... G06F 1/16 |

* cited by examiner

*Primary Examiner* — Sang V Nguyen
(74) *Attorney, Agent, or Firm* — Kile Park Reed & Houtteman PLLC

(57) ABSTRACT

A method of fabricating a display device includes: providing on a first jig a display panel to which is attached one side of a connection circuit board; providing a main circuit board on a second jig; supporting the connection circuit board with a supporter between the first jig and the second jig; and attaching another side of the connection circuit board to the main circuit board, wherein the supporter includes a base part and a plurality of guides on the base part, the guides being adjusted in length in an up-and-down direction.

10 Claims, 21 Drawing Sheets

DISPLAY DEVICE FABRICATING METHOD

CROSS-REFERENCE TO RELATED APPLICATION

This application claims priority to and benefits of Korean Patent Application No. 10-2019-0047749 under 35 U.S.C § 119, filed in the Korean Intellectual Property Office on Apr. 24, 2019, the entire contents of which are incorporated herein by reference.

BACKGROUND

(a) Technical Field

The disclosure generally relates to a display device assembling apparatus and a display device fabricating method using the same.

(b) Description of the Related Art

In general, after a display panel is fabricated, a connection circuit board may be attached to and connects to the display panel and a main circuit board. For example, a tape automated bonding (TAB) scheme uses an anisotropic conductive film (ACF) to attach the connection circuit board to the display panel and the main circuit board.

When the connection circuit board is attached, an apparatus may be required to support the connection circuit board in order to prevent the connection circuit board from dropping downwardly.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device assembling apparatus capable of fabricating a display device having high durability.

Embodiments provide a method of fabricating a display device having high durability.

According to embodiments, a display device assembling apparatus include: a first jig that supports a display panel; a second jig that supports a main circuit board; and a supporter that supports a plurality of connection circuit boards that connect the display panel to the main circuit board and the supporter is disposed between the first jig and the second jig. The supporter includes a base part and a plurality of guides disposed on the base part. Each of the guides being adjusted in length in an up-and-down direction.

Each of the plurality of guides may be adjusted in length in a vertical direction.

The plurality of guides may be spaced apart from each other.

Each of the plurality of guides may include: a head part; and a cylinder part disposed between the base part and the head part and that is adjusted in length in the up-and-down direction.

The plurality of guides may include at least a first and a second cylinder part and the second cylinder part may extend in a direction further than the first cylinder part.

The plurality of connection circuit boards may include: a plurality of first connection circuit boards; and a plurality of second connection circuit boards disposed on corresponding plurality of first connection circuit boards. The plurality of guides may include: a plurality of first guides each of which supports one surface of a corresponding one of the plurality of first connection circuit boards; and a plurality of second guides each of which supports one surface of a corresponding one of the plurality of second connection circuit boards.

The plurality of first guides and the plurality of second guides may be spaced apart from and alternately arranged with each other along a first direction.

The plurality of first guides may be disposed along a first direction. The plurality of second guides may be disposed along the first direction. The plurality of first guides may be spaced apart from the plurality of second guides in a second direction different from the first direction.

The apparatus may further comprise: a subsidiary base part that faces the base part; a connection part that connects the base part to the subsidiary base part; a plurality of third guides disposed on the subsidiary base part and that fix other surfaces of the plurality of first connection circuit boards, the other surfaces of the plurality of first connection circuit boards facing the one surfaces of the first plurality of connection circuit boards; and a plurality of fourth guides disposed on the subsidiary base part and that fix other surfaces of the plurality of second connection circuit boards, the other surfaces of the plurality of second connection circuit boards facing the one surfaces of the plurality of first connection circuit boards.

The plurality of third guides may be disposed in a one-to-one correspondence with the plurality of first guides. The plurality of fourth guides may be disposed in a one-to-one correspondence to the plurality of second guides.

Each of the plurality of third and fourth guides may include an adsorbing segment.

Each of the plurality of third and fourth guides may include: a head part; and a cylinder part disposed between the subsidiary base part and the head part and that is adjusted in length in the up-and-down direction.

The first jig may include: a first support substrate; a first jig driver that adjusts a position of the first support substrate; and a first jig cylinder disposed between the first support substrate and the first jig driver and that is adjusted in length in the up-and-down direction.

The second jig may include: a second support substrate; a second jig driver that adjusts a position of the second support substrate; and a second jig cylinder disposed between the second support substrate and the second jig driver and that is adjusted in length in the up-and-down direction.

The apparatus may further comprise a lateral side part that connects the supporter to the first jig. The lateral side part may extend in a direction from the base part toward the first jig.

A method of fabricating a display device comprises: providing on a first jig a display panel to which is attached one side of a connection circuit board; providing a main circuit board on a second jig; supporting the connection circuit board with a supporter between the first jig and the second jig; and attaching another side of the connection circuit board to the main circuit board. The supporter includes a base part and a plurality of guides on the base part, the guides being adjusted in length in an up-and-down direction.

The plurality of guides may be spaced part from each other.

The connection circuit board may include a first connection circuit board and a second connection circuit board on the first connection circuit board. The plurality of guides may include a first guide and a second guide. The step of supporting the connection circuit board with the supporter may include: supporting one surface of the first connection circuit board with the first guide; and supporting one surface of the second connection circuit board with the second guide.

The first guide may include: a first head part on the base part; and a first cylinder part disposed between the base part and the first head part and that is adjusted in length in the up-and-down direction. The second guide may include: a second head part on the base part; and a second cylinder part disposed between the base part and the second head part and that is adjusted in length in the up-and-down direction.

The second cylinder part may be adjusted to have a length greater than a length of the first cylinder part.

The second cylinder part may be adjusted to have a length longer than a length of the first cylinder part.

The second connection circuit board may bend in an extending direction of the second cylinder part.

Forming the supporter may further include: a subsidiary base part that faces the base part; a connection part that connects the base part to the subsidiary base part; a third guide disposed on the subsidiary base part and that supports another surface of the first connection circuit board, the other surface of the first connection circuit board facing the one surface of the first connection circuit board; and a fourth guide disposed on the subsidiary base part and that supports another surface of the second connection circuit board, the other surface of the second connection circuit board facing the one surface of the second connection circuit board. The supporting the connection circuit board with the supporter may further include: fixing the other surface of the first connection circuit board with the third guide; and fixing the other surface of the second connection circuit board with the fourth guide.

The third guide may include: a third head part on the subsidiary base part; and a third cylinder part disposed between the subsidiary base part and the third head part and that is adjusted in length in the up-and-down direction. The fourth guide may include: a fourth head part on the subsidiary base part; and forming a fourth cylinder part disposed between the subsidiary base part and the fourth head part and that is adjusted in length in the up-and-down direction. The supporting the connecting circuit board with the supporter may further include adjusting the third cylinder part to have a length greater than a length of the fourth cylinder part.

Each of the third and fourth head parts may include forming an adsorbing segment. The supporting the connection circuit board with the supporter may further include: allowing the adsorbing segment of the third heard part to adsorb the other surface of the first connection circuit board; and allowing the adsorbing segment of the fourth head part to adsorb the other surface of the second connection circuit board.

BRIEF DESCRIPTION OF THE DRAWINGS

An additional appreciation according to the embodiments will become more apparent by describing in detail the embodiments thereof with reference to the accompanying drawings, wherein:

FIGS. 14A to 14C illustrate schematic cross-sectional views taken along line I-I' of FIG. 13. FIGS. 15A and 15B illustrate schematic cross-sectional views taken along line II-II' of FIG. 13.

DETAILED DESCRIPTION OF EMBODIMENTS

Figure 1:
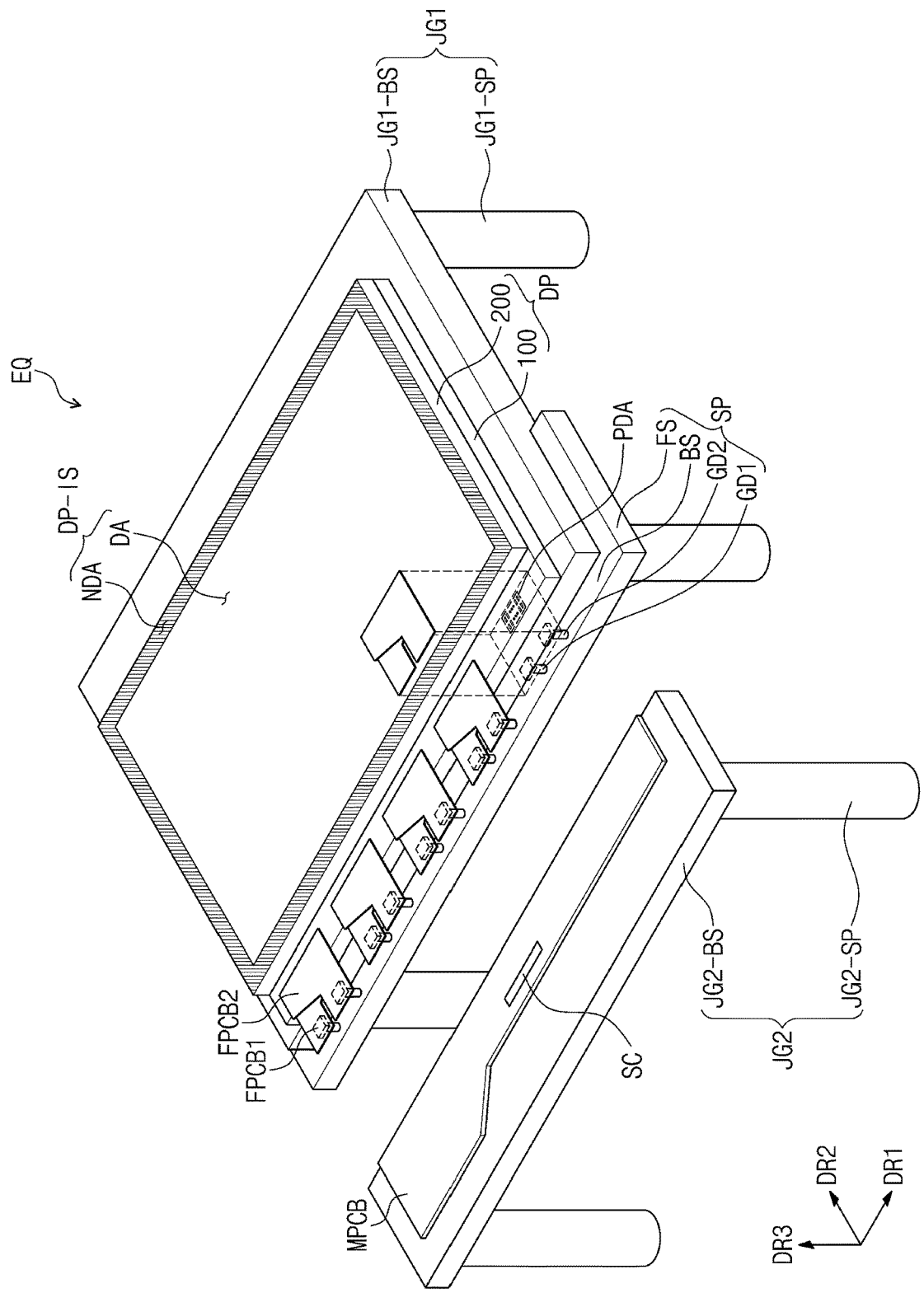
FIG. 1 illustrates a perspective view showing a display device assembling apparatus according to embodiments.

Embodiments will be described hereinafter with reference to the accompanying drawings. Although the disclosure may be modified in various manners and have additional embodiments, embodiments are illustrated in the accompanying drawings and will be mainly described in the specification. However, the scope of the disclosure is not limited to the embodiments in the accompanying drawings and the specification and should be construed as including all the changes, equivalents and substitutions included in the spirit and scope of the disclosure.

Some of the parts which are not associated with the description may not be provided in order to describe embodiments and like reference numerals refer to like elements throughout the specification.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

In the drawings, sizes and thicknesses of elements may be enlarged for clarity and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a schematic cross-sectional view" means when a schematic cross-section taken by vertically cutting an object portion is viewed from the side. Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" or "have" are used in this specification, they or it may specify the presence of stated features, integers, steps, operations, elements and/or components, but do not preclude the presence or addition of other features, integers, steps, operations, elements, components, and/or any combination thereof.

The term "and/or" includes one or more combinations defined by associated components.

It will be understood that, although the terms first, second, or third or the like may be used herein to describe various components, these components should not be limited by these terms. These terms are only used to distinguish one component from another component. For example, a first component could be termed a second component, and vice versa without departing from the scope of the disclosure. Unless the context clearly indicates otherwise, the singular forms are intended to include the plural forms as well.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined, all terms used herein including technical and scientific terms have the same meaning as generally or commonly understood by those of ordinary skill in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

The following will now describe embodiments in conjunction with the accompanying drawings.

FIG. 1 illustrates a perspective view showing a display device assembling apparatus EQ according to an embodiment. Referring to FIG. 1, the display device assembling apparatus EQ includes a first jig JG1, a second jig JG2, and a supporter SP.

The first jig JG1 may support a display panel DP. The first jig JG1 may include a first support substrate JG1-BS supporting the display panel DP and a first jig supporter JG1-SP supporting the first support substrate JG1-BS.

The second jig JG2 may support a main circuit board MPCB. The second jig JG2 may include a second support substrate JG2-BS supporting the main circuit board MPCB and a second jig supporter JG2-SP supporting the second support substrate JG2-BS.

The supporter SP may include a base part BS and guides GD1 and GD2. The guides GD1 and GD2 may be adjusted in length in a substantially up-and-down or substantially vertical direction. FIG. 1 illustrates the second jig JG2 separated from the supporter SP in order to clearly show each component of the supporter SP, but the second jig JG2 and the supporter SP may be disposed adjacent to each other to place one of the sides of the connection circuit boards FPCB1 and FPCB2 on one side of the main circuit board MPCB.

The supporter SP may be disposed between the first jig JG1 and the second jig JG2. The supporter SP may support connection circuit boards FPCB1 and FPCB2 that connect the display panel DP to the main circuit board MPCB. Each component of the display device assembling apparatus EQ will be further discussed in detail below.

To facilitate understanding of the display device assembling apparatus EQ and a display device fabricating method S1 using the apparatus EQ, the following will first explain a display device DD fabricated in accordance with some embodiments.

Figure 2:
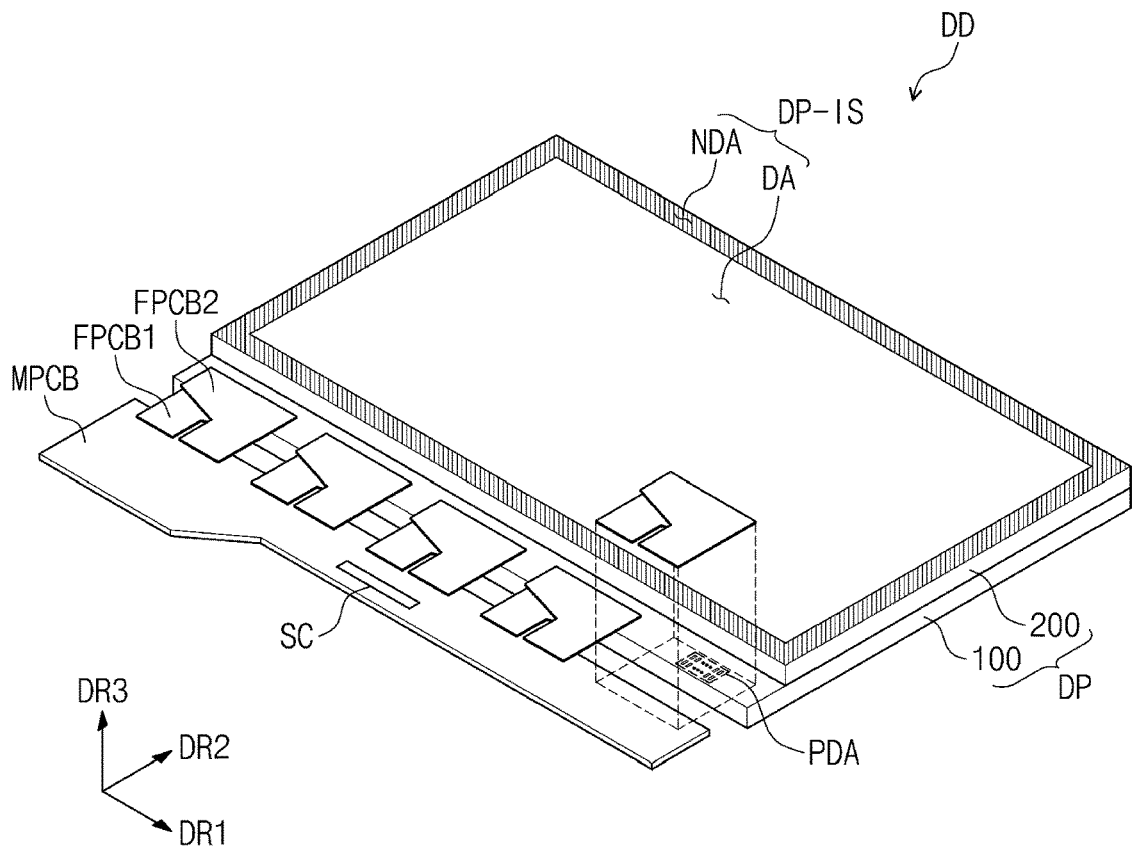
FIG. 2 illustrates a perspective view showing a display device manufactured by a display device fabricating method according to embodiments.
Figure 3:
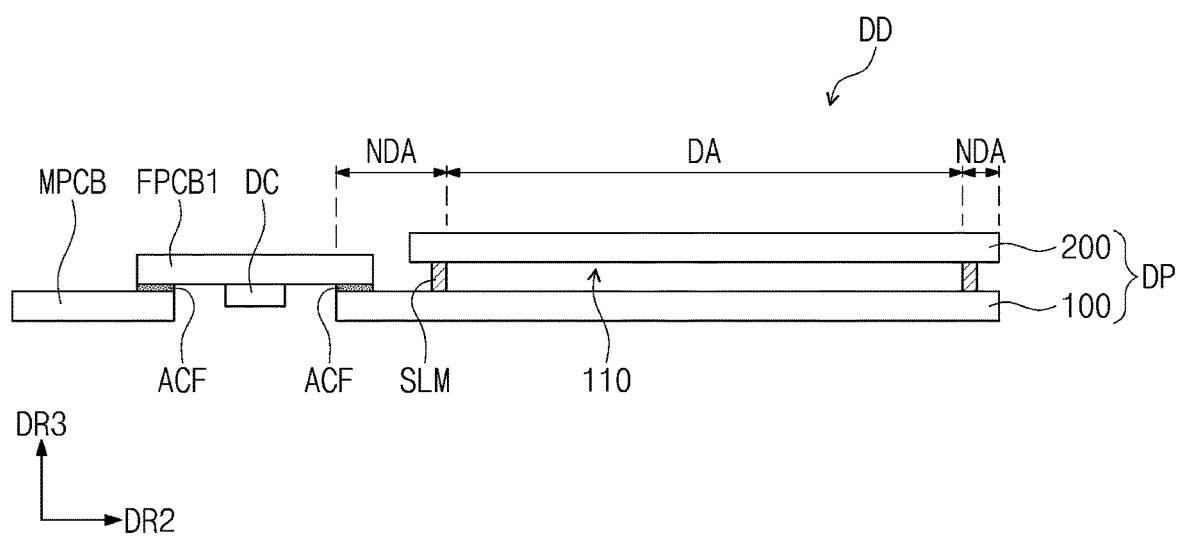
FIG. 3 illustrates a schematic cross-sectional view showing a display device manufactured by a display device fabricating method according to embodiments.
Figure 4:
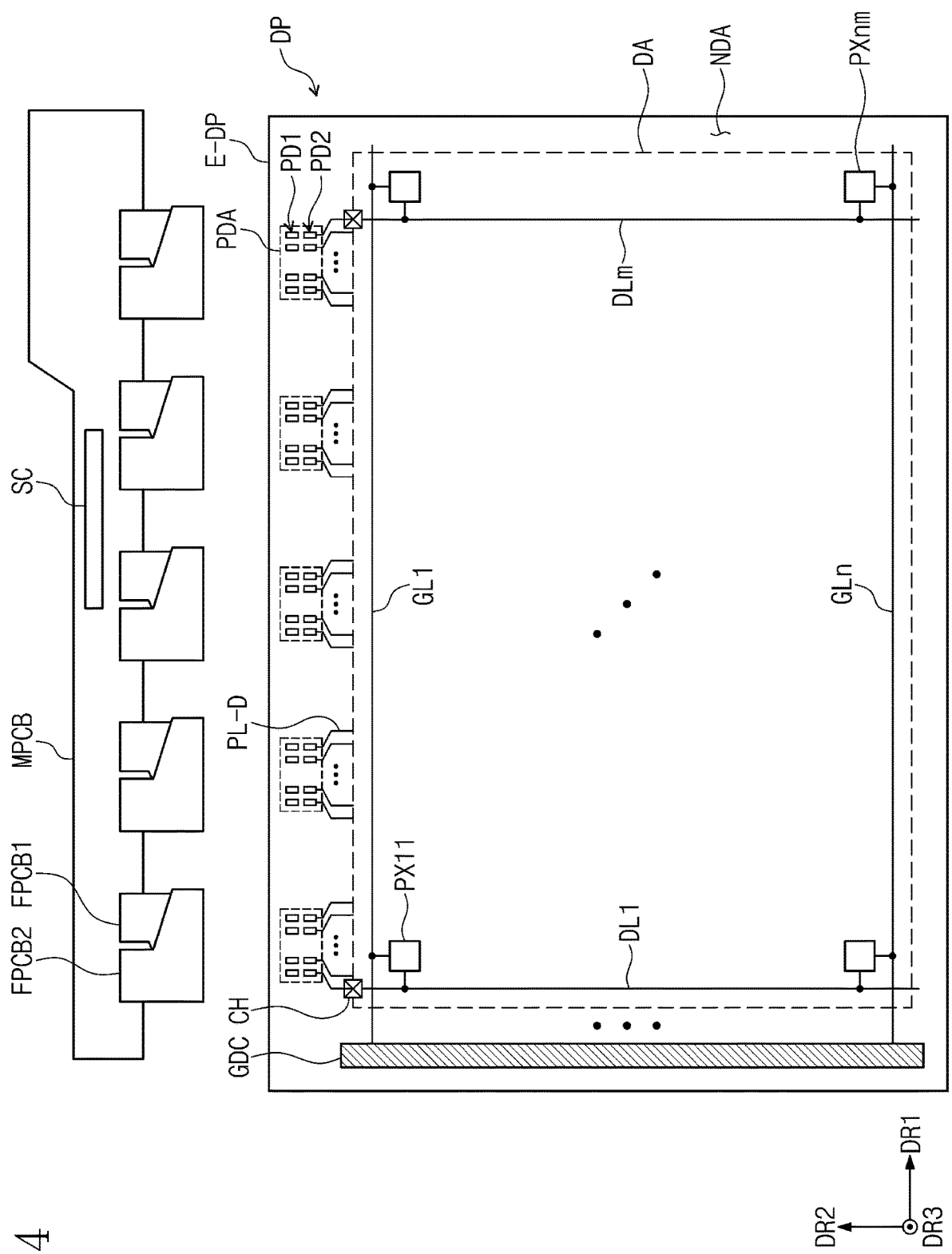
FIG. 4 illustrates a plan view showing a display device manufactured by a display device fabricating method according to embodiments.

FIG. 2 illustrates a perspective view showing the display device DD manufactured by the display device fabricating method S1 according to embodiments. FIG. 3 illustrates a schematic cross-sectional view showing the display device DD manufactured by the display device fabricating method S1 according to embodiments. FIG. 4 illustrates a plan view showing the display device DD manufactured by the display device fabricating method S1 according to embodiments.

Referring to FIGS. 2 to 4, the display device DD includes the display panel DP, the connection circuit boards FPCB1 and FPCB2, and the main circuit board MPCB. In this description, the connection circuit boards FPCB1 and FPCB2 are illustrated to have their driver chips DC mounted thereon, but the disclosure may not be limited thereto. The driver chips DC may not be mounted on the connection circuit boards FPCB1 and FPCB2, but may be mounted either on the display panel DP or on the main circuit board MPCB.

Figure 5:
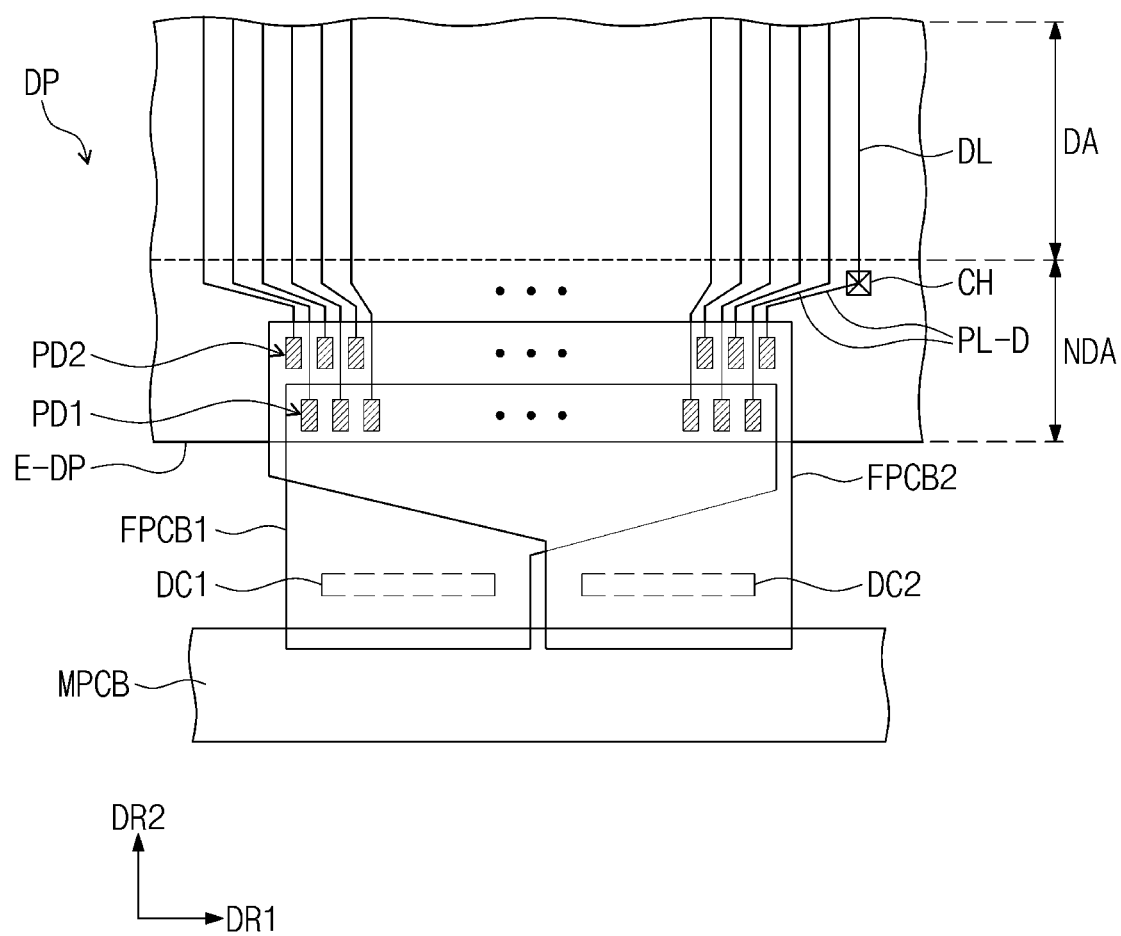
FIG. 5 illustrates an enlarged plan view showing a display device manufactured by a display device fabricating method according to embodiments.

When the driver chip DC is mounted on a first connection circuit board FPCB1, the driver chip DC may be called a first driver chip (see DC1 of FIG. 5), and when the driver chip DC is mounted on a second connection circuit board FPCB2, the driver chip DC may be called a second driver chip (see DC2 of FIG. 5).

Although not shown, the display device DD may include a sash member or a molding member, and based on a type of the display panel, may include a backlight unit. The display device DD may include a housing (not shown) that accommodates the display panel DP, the connection circuit boards FPCB1 and FPCB2, and the main circuit board MPCB.

The display panel DP may be one of a liquid crystal display panel, a plasma display panel, an electrophoretic display panel, microelectromechanical system (MEMS) display panel, an electrowetting display panel, an organic light emitting display panel, and a quantum dot light emitting display panel, but the disclosure may not be especially limited thereto and may include other display panels as would be appreciated and understood by those of ordinary skill in the art.

Referring to FIG. 3, the display panel DP may include a first display substrate 100 and a second display substrate 200 that may face and may be spaced apart from the first display substrate 100. A cell gap may be formed between the first display substrate 100 and the second display substrate 200. The cell gap may be maintained by a sealant SLM through which the first display substrate 100 and the second display substrate 200 are coupled to each other. The first display substrate 100 and the second display substrate 200 may have therebetween a gray-scale display layer for creating an image. FIG. 3 shows the display panel DP including a liquid crystal layer 110 as the gray-scale display layer. The disclosure, however, may not be limited thereto. For example, the display panel DP may include an organic light emitting layer, a quantum dot light emitting layer, or other layers that may be appreciated and understood by those of ordinary skill in the art.

As shown in FIG. 2, the display panel DP may display an image on a display surface DP-IS. The display surface DP-IS may be parallel to a plane defined by a first directional axis DR1 and a second directional axis DR2. The display surface DP-IS may include a display area DA and a non-display area NDA. The non-display area NDA may be defined along an edge of the display area DA. The display area DA may be surrounded by the non-display area NDA.

In embodiments, the non-display area NDA may be disposed on only one-side region adjacent to the connection circuit boards FPCB1 and FPCB2.

A third directional axis DR3 indicates a normal direction of the display surface DP-IS, or a thickness direction of the display panel DP. The third directional axis DR3 differentiates a front surface (or top surface) and a rear surface (or bottom surface) of each layer or unit discussed below. However, the first, second, and third directional axes DR1, DR2, and DR3 are merely illustratively shown in embodiments of the disclosure. First, second, and third directions are defined hereinafter to refer to directions respectively indicated by the first, second, and third directional axes DR1, DR2, and DR3, and are allocated the same reference numerals thereto.

In FIGS. 2 to 4, the display panel DP is illustrated to have a flat display surface, but the disclosure may not be limited thereto. The display device DD may include a curved display surface or a cubic display surface. The cubic display surface may include display regions oriented in different directions.

A signal controller SC may be mounted on the main circuit board MPCB. The signal controller SC receives image data and control signals from a graphic controller (not shown) provided externally. The signal controller SC may provide the display panel DP with control signals.

The connection circuit boards FPCB1 and FPCB2 may be electrically connected to the display panel DP and the main circuit board MPCB. The connection circuit boards FPCB1 and FPCB2 may transfer signals from the main circuit board MPCB to the driver chip DC, and may transfer signals from the driver chip DC to the display panel DP. In embodiments, the driver chip DC may be a data driver circuit. In embodiments, the connection circuit boards FPCB1 and FPCB2 may transfer signals from the signal controller SC to the display panel DP.

The connection circuit boards FPCB1 and FPCB2 may be coupled through conductive adhesive members to the display panel DP and the main circuit board MPCB. The conductive adhesive members may include an anisotropic conductive film ACF.

In embodiments, the connection circuit boards FPCB1 and FPCB2 may include two types of circuit boards. The two types of circuit boards included in the connection circuit boards FPCB1 and FPCB2 may be coupled to different pad rows that may be disposed on a single pad area PDA. In embodiments, the pad area PDA is illustrated to lie on the first display substrate 100, but the disclosure may not be limited thereto. In embodiments, the single pad area PDA may be disposed on the second display substrate 200.

FIG. 4 shows a planar arrangement relationship between pixels PX11 to PXnm and signal lines GL1 to GLn, DL1 to DLm, and PL-D. The signal lines GL1 to GLn, DL1 to DLm, and PL-D may include gate lines GL1 to GLn, data lines DL1 to DLm, and subsidiary signal lines PL-D.

The gate lines GL1 to GLn may extend in the first direction DR1 and may be arranged in the second direction DR2, and the data lines DL1 to DLm are insulated from and intersect the gate lines GL1 to GLn. The gate lines GL1 to GLn and the data lines DL1 to DLm may be disposed crosswise on the display area DA. The subsidiary signal lines PL-D may be disposed crosswise on the non-display area NDA, and may be connected to the gate lines GL1 to GLn and the data lines DL1 to DLm.

The subsidiary signal lines PL-D, or data subsidiary signal lines, connected to the data lines DL1 to DLm may be disposed on a layer different from that on which the data lines DL1 to DLm are disposed. One of the data lines DL1 to DLm may be electrically connected through a contact hole CH to a corresponding one of the data subsidiary signal lines PL-D. The contact hole CH may penetrate at least one dielectric layer between the data lines DL1 to DLm and the data subsidiary signal lines PL-D. FIG. 4 exemplarily shows two contact holes CH.

In embodiments, the contact hole CH may be omitted. The data lines DL1 to DLm and the data subsidiary signal lines PL-D may be disposed on the same layer.

FIG. 4 shows that the gate lines GL1 to GLn are illustrated as signal lines without gate subsidiary signal lines. The disclosure, however, may not be limited thereto. The non-display area NDA may be provided therein with a gate driver circuit GDC to which the gate lines GL1 to GLn are electrically connected.

Each of the pixels PX11 to PXnm may be connected to a corresponding one of the gate lines GL1 to GLn and to a corresponding one of the data lines DL1 to DLm. Each of the pixels PX11 to PXnm may include a pixel driver circuit and a display element.

As shown in FIG. 4, two pad rows PD1 and PD2 are disposed on each pad area PDA. Each of the two pad rows PD1 and PD2 may include pads arranged in the first direction DR1. A first pad row PD1 and a second pad row PD2 may be spaced apart from each other in a direction (e.g., the second direction DR2) intersecting the first direction DR1. When viewed in the second direction DR2, the second pad row PD2 is farther away than the first pad row PD1 from an edge E-DP of the display panel DP, and is closer than the first pad row PD1 to the display area DA. The pads of the first and second pad rows PD1 and PD2 may be connected to corresponding data subsidiary signal lines PL-D.

Figure 6:
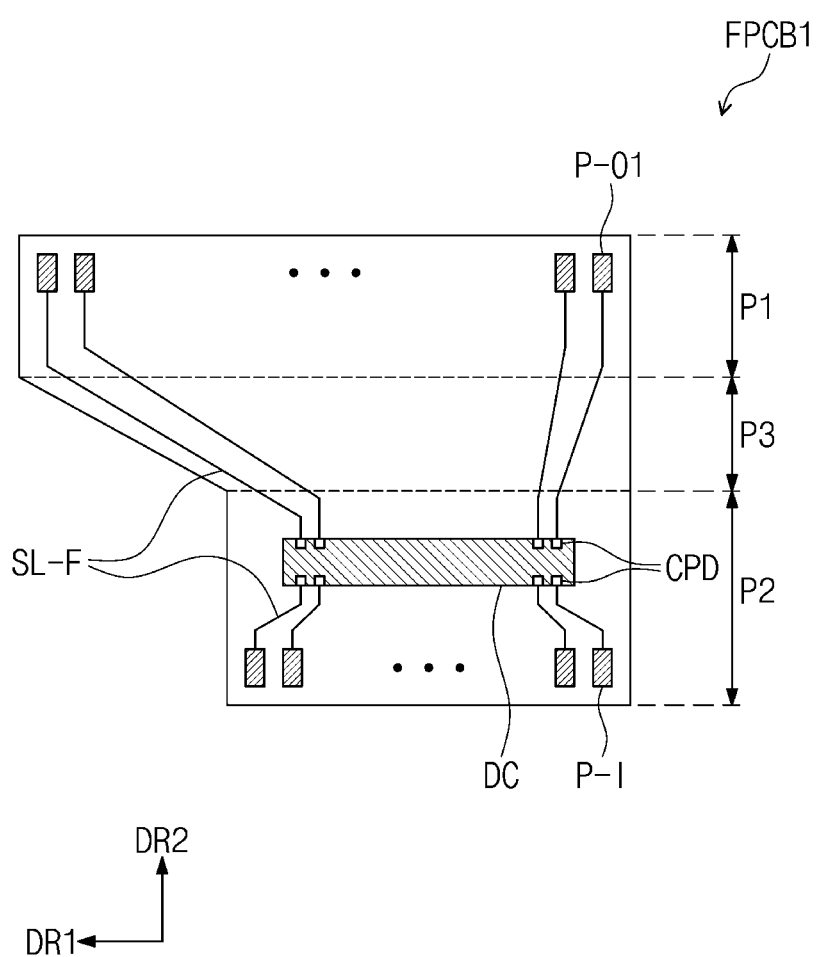
FIG. 6 illustrates a bottom view showing a connection circuit board according to embodiments.

FIG. 5 illustrates an enlarged plan view showing the display device DD manufactured by the display device fabricating method S1 according to embodiments. FIG. 6 illustrates a bottom view showing the first connection circuit board FPCB1 according to embodiments.

Referring to FIG. 5, the pad area PDA may be provided thereon with the first pad row PD1 and the second pad row PD2 that constitute different rows. Each of the first and second pad rows PD1 and PD2 includes pads. The first connection circuit board FPCB1 may be electrically coupled to the first pad row PD1, and the second connection circuit board FPCB2 may be electrically coupled to the second pad row PD2.

The first and second connection circuit boards FPCB1 and FPCB2 may have similar structures, but may be partially different in terms of size and shape. For example, the second connection circuit board FPCB2 may have the same or similar shape as that of the first connection circuit board FPCB1, but may have a greater width and length than those of the first connection circuit board FPCB1. FIG. 6 exemplarily shows the first connection circuit board FPCB1. The first connection circuit board FPCB1 may include a dielectric layer (not shown), pads CPD, P-O1, and P-I, and signal lines SL-F. The dielectric layer may be provided thereon with the signal lines SL-F and the pads CPD, P-O1, and P-I.

The pads CPD, P-O1, and P-I may include connection pads CPD coupled to connection pads of the driver chip DC, first pads P-O1 (defined hereinafter as first output pads) coupled to the display panel DP, and second pads P-I (defined hereinafter as input pads) coupled to the main circuit board MPCB. The signal lines SL-F may connect the connection pads CPD to the first output pads P-O1, and also connect the connection pads CPD to the input pads P-I.

When the driver chip DC is not provided, the signal lines SL-F may connect the first output pads P-O1 to the input pads P-I.

The first connection circuit board FPCB1 may include three parts that are divided by width in the first direction DR1. For example, the first connection circuit board FPCB1 may include a first part P1 on which the first output pads P-O1 are disposed, a second part P2 on which the input pads P-I are disposed, and a third part P3 that connects the first part P1 to the second part P2. The first part P1 has a width greater than that of the second part P2. The third part P3 has a width that decreases as approaching the second part P2 from the first part P1. For example, the width of the third part P3 may linearly decrease as approaching the second part P2 from the first part P1. The third part P3 may have a linear shape at one side and an oblique shape at another side facing the one side. The driver chip DC may be mounted on the second part P2.

The previous description regarding the first connection circuit board FPCB1 may be identically applicable to the second connection circuit board FPCB2, except that the first output pads P-O1 may be referred to as second output pads.

In embodiments, because the second pad row PD2 is farther away than the first pad row PD1 from the edge E-DP of the display panel DP, the second connection circuit board FPCB2 may have a length greater than that of the first connection circuit board FPCB1. For example, referring to FIG. 5, the second circuit board FPCB2 may have a length in the second direction DR2 greater than a length in the second direction DR2 of the first connection circuit board FPCB1. For example, as discussed below, a display device fabricating method (see S1 of FIG. 12) may include a step in which the second connection circuit board FPCB2 bends upwardly, and accordingly, the second connection circuit board FPCB2 may have a length greater than that of the first connection circuit board FPCB1.

Figure 7A:
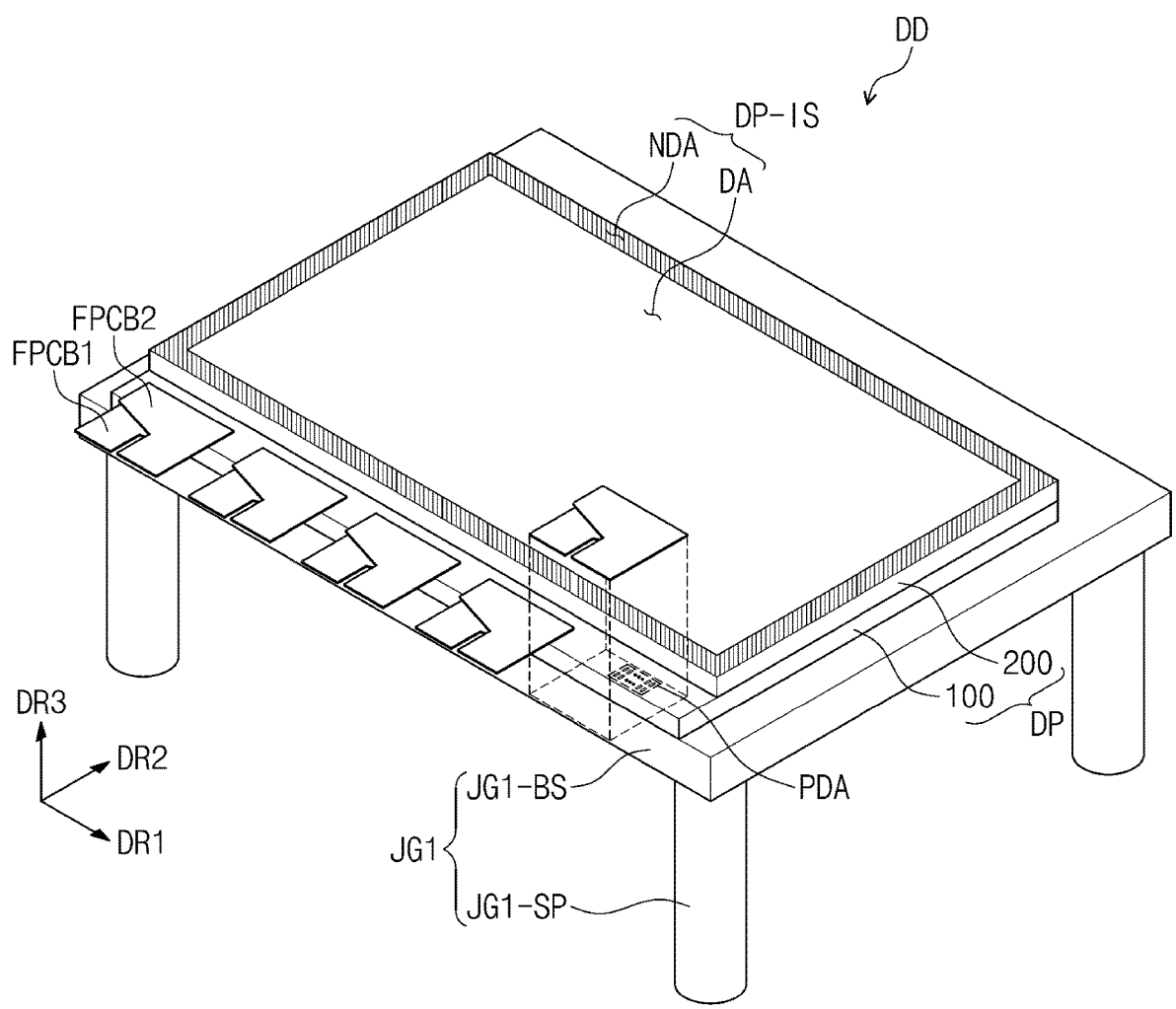
FIGS. 7A and 7B illustrate perspective views showing a first jig according to embodiments.
Figure 7B:
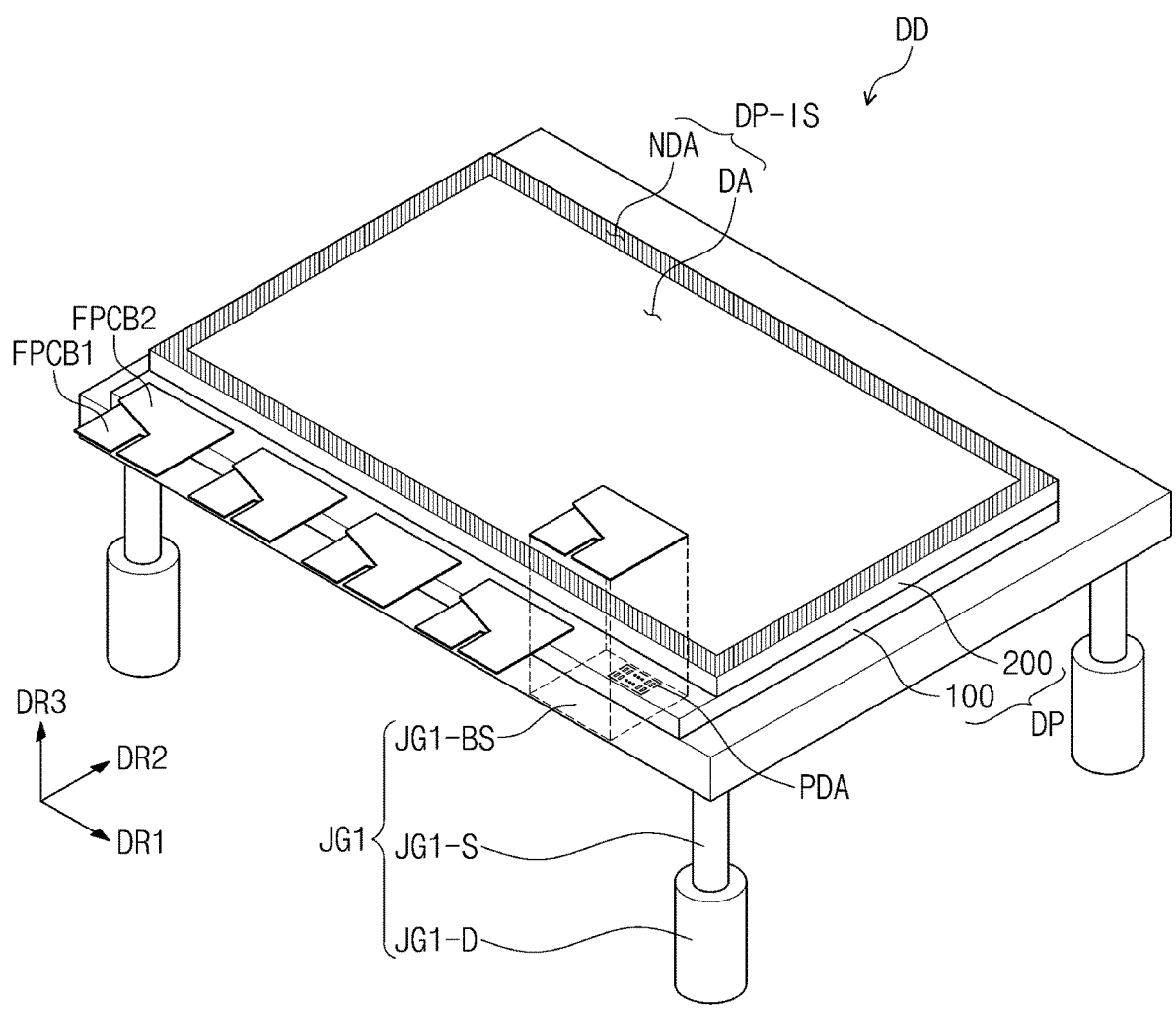

FIGS. 7A and 7B illustrate perspective views showing the first jig JG1 according to embodiments. In FIGS. 7A and 7B, the first jig JG1 is illustrated to support the display panel DP according to embodiments.

As discussed above, the first jig JG1 may include the first support substrate JG1-BS and the first jig supporter JG1-SP. The first support substrate JG1-BS may support a member of the display device (see DD of FIG. 2). For example, the first jig JG1 may support the display panel DP according to embodiments. FIG. 7A shows that the first support substrate JG1-BS has a rectangular shape, but the shape of the first support substrate JG1-BS may be variously changed based on that of the member supported by the first jig JG1. For example, the first support substrate JG1-BS may be provided with the display panel DP on its surface which has an oval shape, a circular shape, or a polygonal shape such as a rectangular shape or other shapes as may be appreciated and understood by those of ordinary skill in the art.

The first support substrate JG1-BS may be supported by the first jig supporter JG1-SP disposed on a bottom surface thereof. FIG. 7A shows that the first jig supporter JG1-SP is adjacent to a corner of the first support substrate JG1-BS, but the number and shape of the first jig supporter JG1-SP are not especially limited thereto. For example, the first jig supporter JG1-SP may have a cylindrical pillar shape, a rectangular pillar shape, a polygonal pillar shape, or a shape substantially extending from one side of the first support substrate JG1-BS to another side the first support substrate JG1-BS. In embodiments, the first jig supporter JG1-SP may be omitted.

Referring to FIG. 7B, the first jig supporter JG1-SP may be replaced with a first jig driver JG1-D and a first jig cylinder JG1-S. The first jig driver JG1-D may control a height of the first jig JG1. The first jig cylinder JG1-S may be disposed between the first support substrate JG1-BS and the first jig driver JG1-D. The first jig cylinder JG1-S may connect the first support substrate JG1-BS to the first jig driver JG1-D. The first jig driver JG1-D may allow the first jig cylinder JG1-S to have a length adjustable in a substantially up-and-down direction. The first jig driver JG1-D may drive the first jig cylinder JG1-S to extend or retract in the third direction DR3. For example, the first jig driver JG1-D may adjust a position of the first support substrate JG1-BS. The first jig cylinder JG1-S may be a hydraulic cylinder. The first jig driver JG1-D may have a length corresponding to a distance between a bottom surface of the first support substrate JG1-BS and a top surface of the first jig driver JG1-D.

The numbers and shapes of the first jig driver JG1-D and the first jig cylinder JG1-S are not especially limited to that shown in the figures. In embodiments, neither the first jig driver JG1-D nor the first jig cylinder JG1-S may be provided.

Figure 8A:
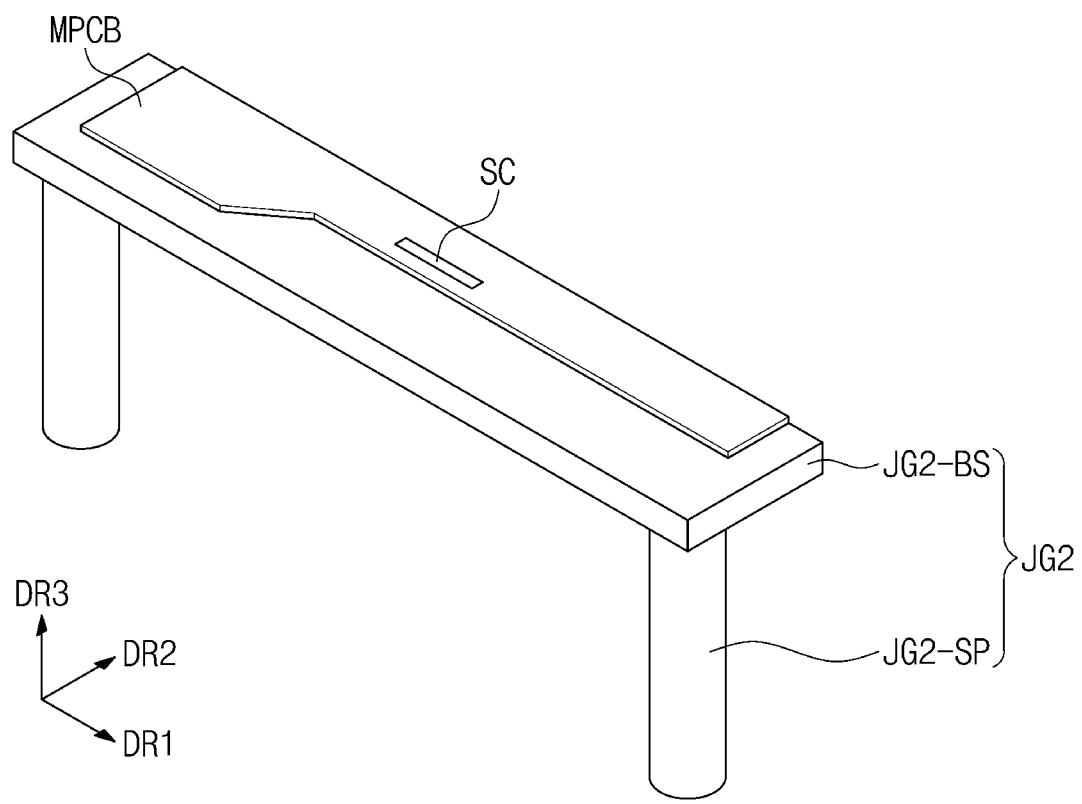
FIGS. 8A and 8B illustrate perspective views showing a second jig according to embodiments.
Figure 8B:
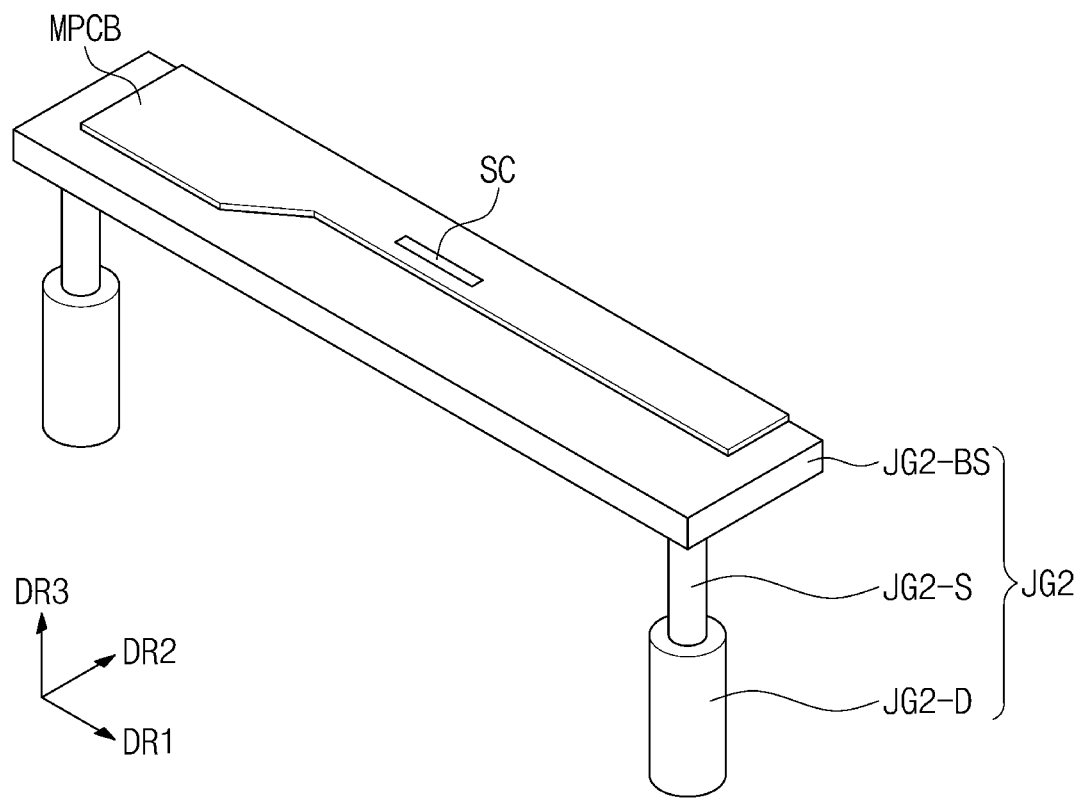

FIGS. 8A and 8B illustrate perspective views showing the second jig JG2 according to embodiments. FIGS. 8A and 8B show that the second jig JG2 supports the main circuit board MPCB according to embodiments.

Referring to FIG. 8A, as discussed above, the second jig JG2 may include the second support substrate JG2-BS and the second jig supporter JG2-SP. The second support substrate JG2-BS may support a member of the display device DD. For example, the second jig JG2 may support the main circuit board MPCB according to embodiments. In embodiments, the previous descriptions regarding the first support substrate JG1-BS and the first jig supporter JG1-SP may be substantially identically applicable to the second support substrate JG2-BS and the second jig supporter JG2-SP, and detailed explanations thereof will be omitted.

Referring to FIG. 8B, the second jig supporter JG2-SP may be replaced with a second jig driver JG2-D and a second jig cylinder JG2-S. The previous descriptions regarding the first jig driver JG1-D and the first jig cylinder JG1-S may be substantially identically applicable to the second jig driver JG2-D and the second jig cylinder JG2-S, and detailed explanations thereof will be omitted.

Figure 9A:
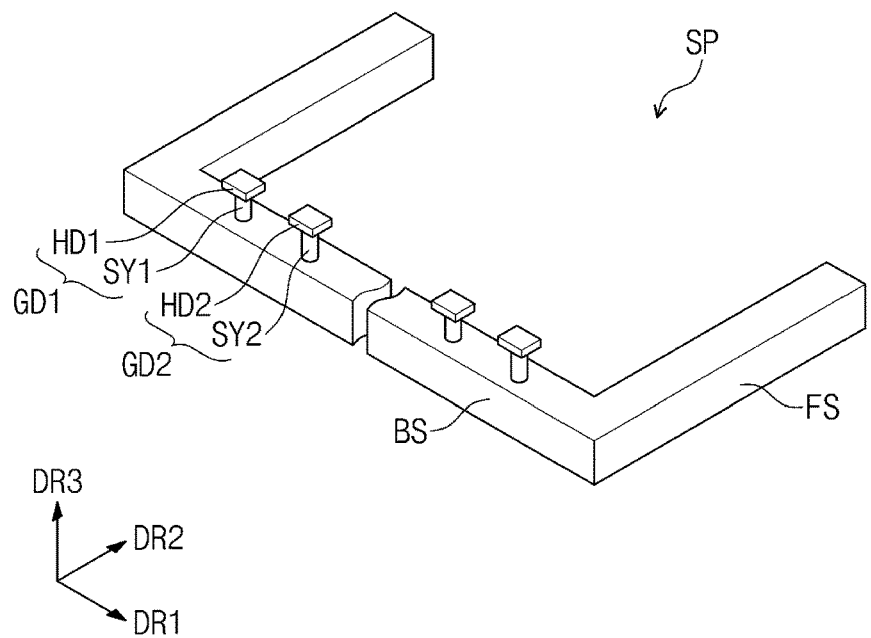
FIGS. 9A and 9B illustrate simplified perspective views showing a supporter according to embodiments.
Figure 9B:
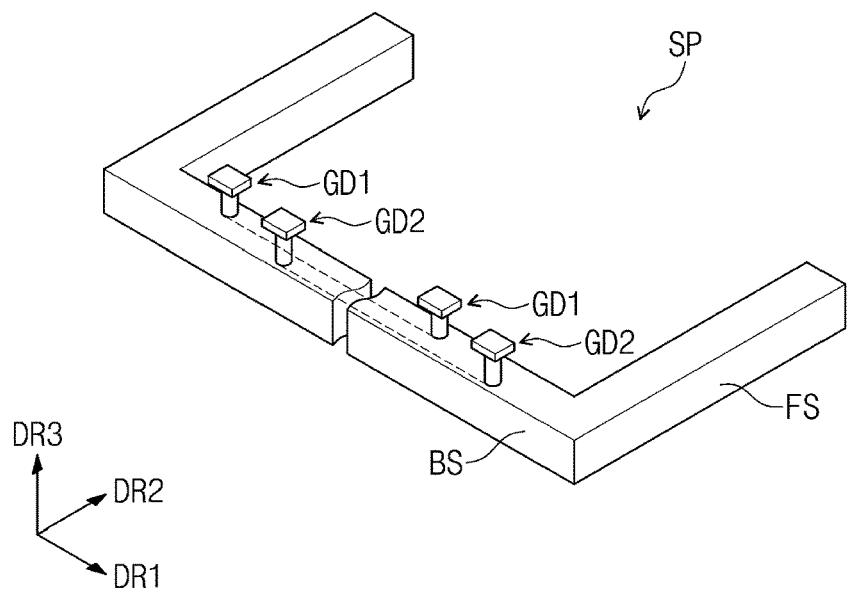

FIGS. 9A and 9B illustrate simplified perspective views showing the supporter SP according to embodiments. Referring to FIG. 9A, the supporter SP may include a base part BS, a lateral side part FS and/or lateral side parts, and guides GD1 and GD2. The lateral side part FS may extend in the second direction DR2, or in a direction from the base part BS toward the first jig JG1, and may fix the supporter SP to the first jig JG1. The supporter SP may be welded on or screw-fixed to the first jig JG1, or any other fixing processes and or materials may be employed to rigidly hold the supporter SP on the first jig JG1. In embodiments, the lateral side part FS may be omitted, and thus, another member may support the supporter SP or may connect the supporter SP to one or more of the first jig JG1 and the second jig JG2.

The base part BS may be provided thereon with the guides GD1 and GD2 that may be spaced apart from each other. The guide GD1 may include a head part HD1 and a cylinder part SY1 that is disposed between the base part BS and the head part HD1, and similarly, the guide GD2 may include a head part HD2 and a cylinder part SY2 that is disposed between the base part BS and the head part HD2. The cylinder parts SY1 and SY2 may connect the head parts HD1 and HD2 to the base part BS. The guides GD1 and GD2 may be independently adjusted in length in a substantially up-and-down direction. The cylinder parts SY1 and SY2 may be adjusted in length in a substantially up-and-down direction on the supporter SP, and in turn the guides GD1 and GD2 may be adjusted in length. For example, the base part BS may include a driver (not shown) that controls heights of the guides GD1 and GD2. The base part BS may allow the cylinder parts SY1 and SY2 to have their lengths adjustable in an up-an-down direction. For example, the lengths of the cylinder parts SY1 and SY2 may extend or retract in the third direction DR3. The cylinder parts SY1 and SY2 may be hydraulic cylinders. The length of each of the cylinder parts SY1 and SY2 may be a distance between a bottom surface of the base part BS and a top surface of a corresponding one of the head parts HD1 and HD2.

The guides GD1 and GD2 may include first guides GD1 each of which has a first head part HD1 and a first cylinder part SY1, and include second guides GD2 each of which has a second head part HD2 and a second cylinder part SY2. The first guides GD1 may support the first connection circuit board FPCB1, and the second guides GD2 may support the second connection circuit board FPCB2. The first head parts HD1 of the first guides GD1 may support the first connection circuit board FPCB1, and the second head parts HD2 of the second guides GD2 may support the second connection circuit board FPCB2.

Referring to FIG. 9A, the first guides GD1 may be disposed alternately with the second guides GD2. The first guides GD1 and the second guides GD2 may be spaced apart from each other in the first direction DR1. The disclosure, however, may not be limited thereto. For example, referring to FIG. 9B, ones of the first and second guides GD1 and GD2 may be arranged along the first direction DR1, and the first guides GD1 may be spaced apart from the second guides GD2 in the second direction DR2 intersecting the first direction DR1. For example, the first guides GD1 may be disposed along the first direction DR1, and the second guides GD2 may be disposed along the second direction DR2 and spaced apart from the first guides GD1 in the second direction DR2 perpendicular to the first direction DR1. For example, the first guides GD1 and the second guides GD2 may be arranged alternately. The disclosure, however, may not be limited thereto. For example, the arrangement of the first and second guides GD1 and GD2 may be changed based on that of the first and second connection circuit boards FPCB1 and FPCB2.

Figure 10:
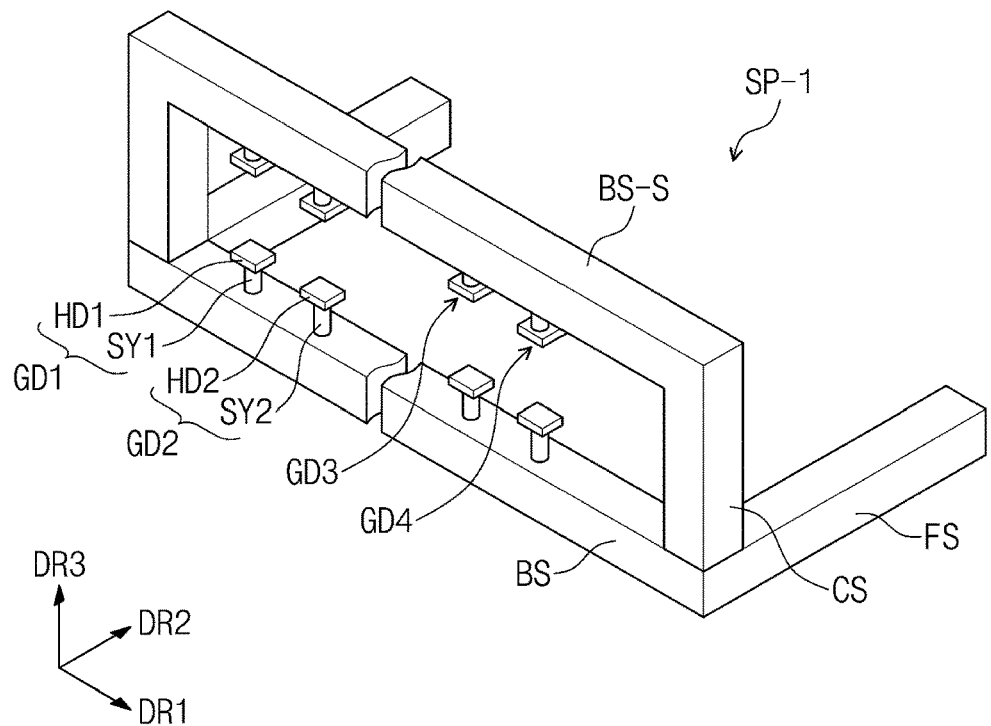
FIG. 10 illustrates a perspective view showing a supporter according to embodiments.
Figure 11:
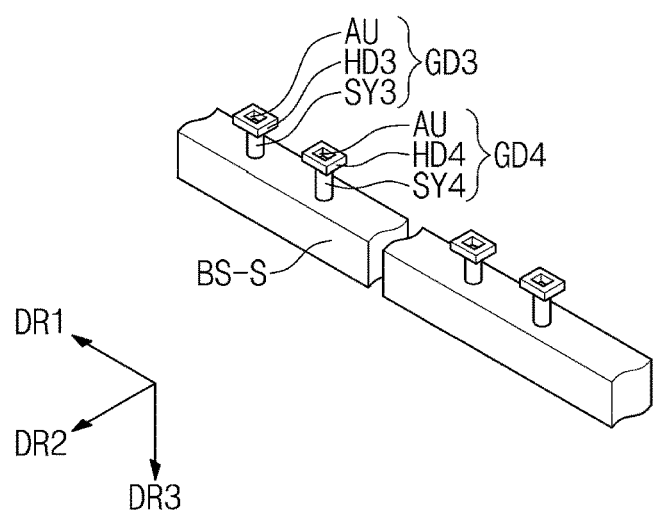
FIG. 11 illustrates an enlarged perspective view partially showing a supporter according to embodiments.

FIG. 10 illustrates a perspective view showing a supporter SP-1 according to embodiments. FIG. 11 illustrates an enlarged perspective view partially showing the supporter SP-1 according to embodiments.

Referring to FIG. 10, the supporter SP-1 may include a subsidiary base part BS-S, a connection part CS, a third guides GD3, and fourth guides GD4.

The subsidiary base part BS-S may face the base part BS. The connection part CS may connect the base part BS to the subsidiary base part BS-S. The third guides GD3 and the fourth guides GD4 may be disposed on the subsidiary base part BS-S. For example, the third guides GD3 and the fourth guides GD4 may be placed on a bottom surface of the subsidiary base part BS-S, and may substantially face the first guides GD1 and the second guides GD2.

The third guides GD3 may be disposed in a one-to-one correspondence to the first guides GD1. The fourth guides GD4 may be disposed in a one-to-one correspondence to the second guides GD2. The first guides GD1 may substantially face the third guides GD3, and the second guides GD2 may substantially face the fourth guides GD4. The disclosure, however, may not be limited thereto.

The previous descriptions regarding the arrangement of the first guides GD1 and the second guides GD2 discussed with reference to FIGS. 9A and 9B may be substantially identically applicable to that of the third guides GD3 and the fourth guides GD4 on the subsidiary base part BS-S, and detailed explanations thereof will be omitted.

Each of the third guides GD3 may include a third head part HD3 and a third cylinder part SY3 that is disposed between the third head part HD3 and the subsidiary base part BS-S. The third cylinder part SY3 may connect the third head part HD3 to the subsidiary base part BS-S. Each of the fourth guides GD4 may include a fourth head part HD4 and a fourth cylinder part SY4 that is disposed between the fourth head part HD4 and the subsidiary base part BS-S. The fourth cylinder part SY4 may connect the fourth head part HD4 to the subsidiary base part BS-S.

The third guides GD3 may support the first connection circuit board FPCB1, and the fourth guides GD4 may support the second connection circuit board FPCB2. For example, the third guides GD3 may fix the first connection circuit board FPCB1, and the fourth guides GD4 may fix the second connection circuit board FPCB2.

Referring to FIG. 11, each of the third and fourth head parts HD3 and HD4 may include an adsorbing segment AU. The adsorbing segment AU may fix a member of the display device DD. For example, the third and fourth head parts HD3 and HD4 may adsorb and fix the first connection circuit board FPCB1 and the second connection circuit board FPCB2, respectively. The adsorbing segments AU may be suction holes formed on the third and fourth head parts HD3 and HD4, sucking air to rigidly place the display device DD.

Although not shown, the adsorbing segment AU may also be included in the first head part HD1 of the first guide GD1 and in the second head part HD2 of the second guide GD2.

The previous descriptions regarding the head parts HD1 and HD2 and the cylinder parts SY1 and SY2 discussed with reference to FIG. 9A may be substantially identically applicable to configurations of the third and fourth head parts HD3 and HD4 and of the third and fourth cylinder parts SY3 and SY4.

Figure 12A:
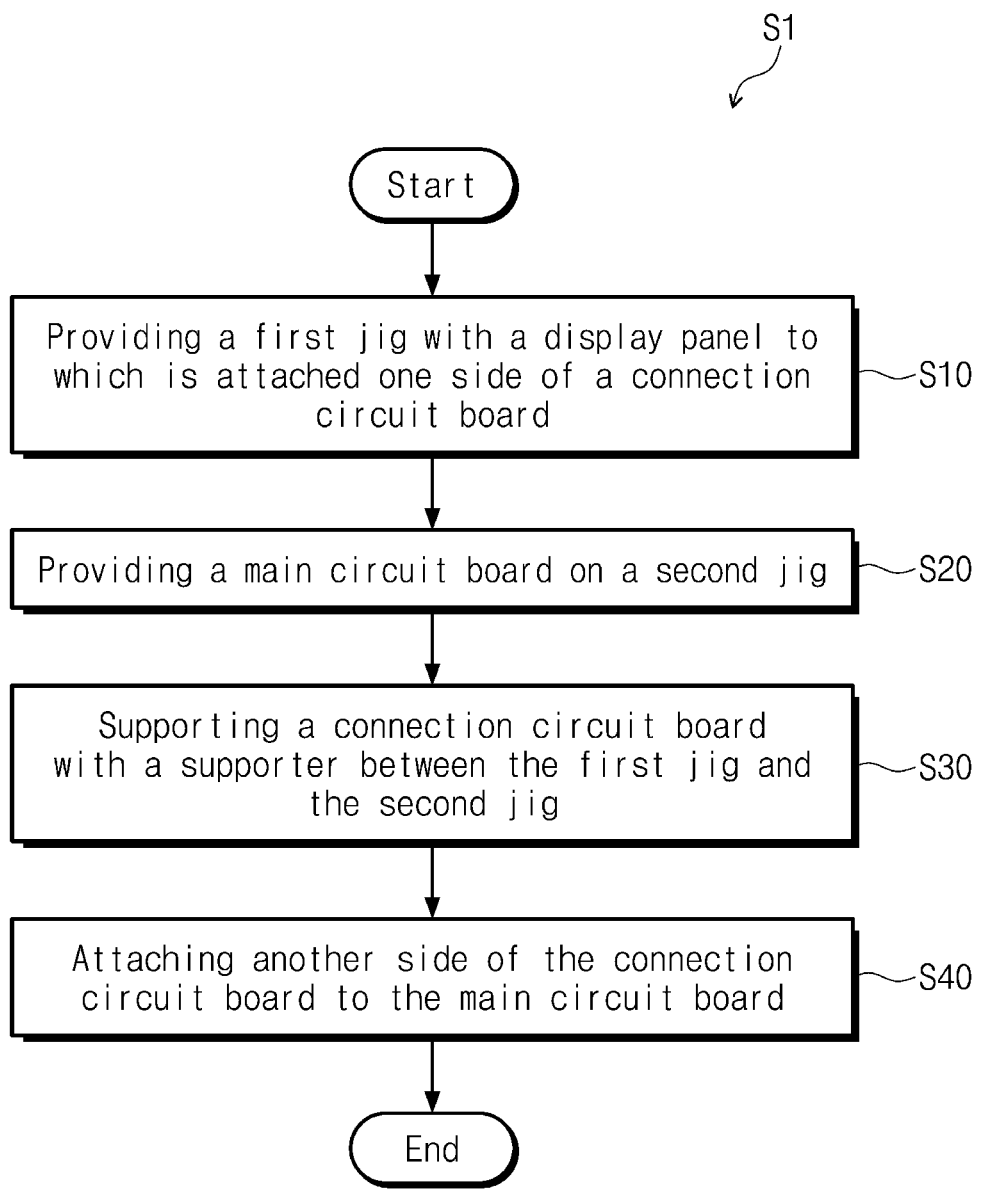
FIGS. 12A to 12C illustrate flow charts showing a display device fabricating method according to embodiments.
Figure 12B:
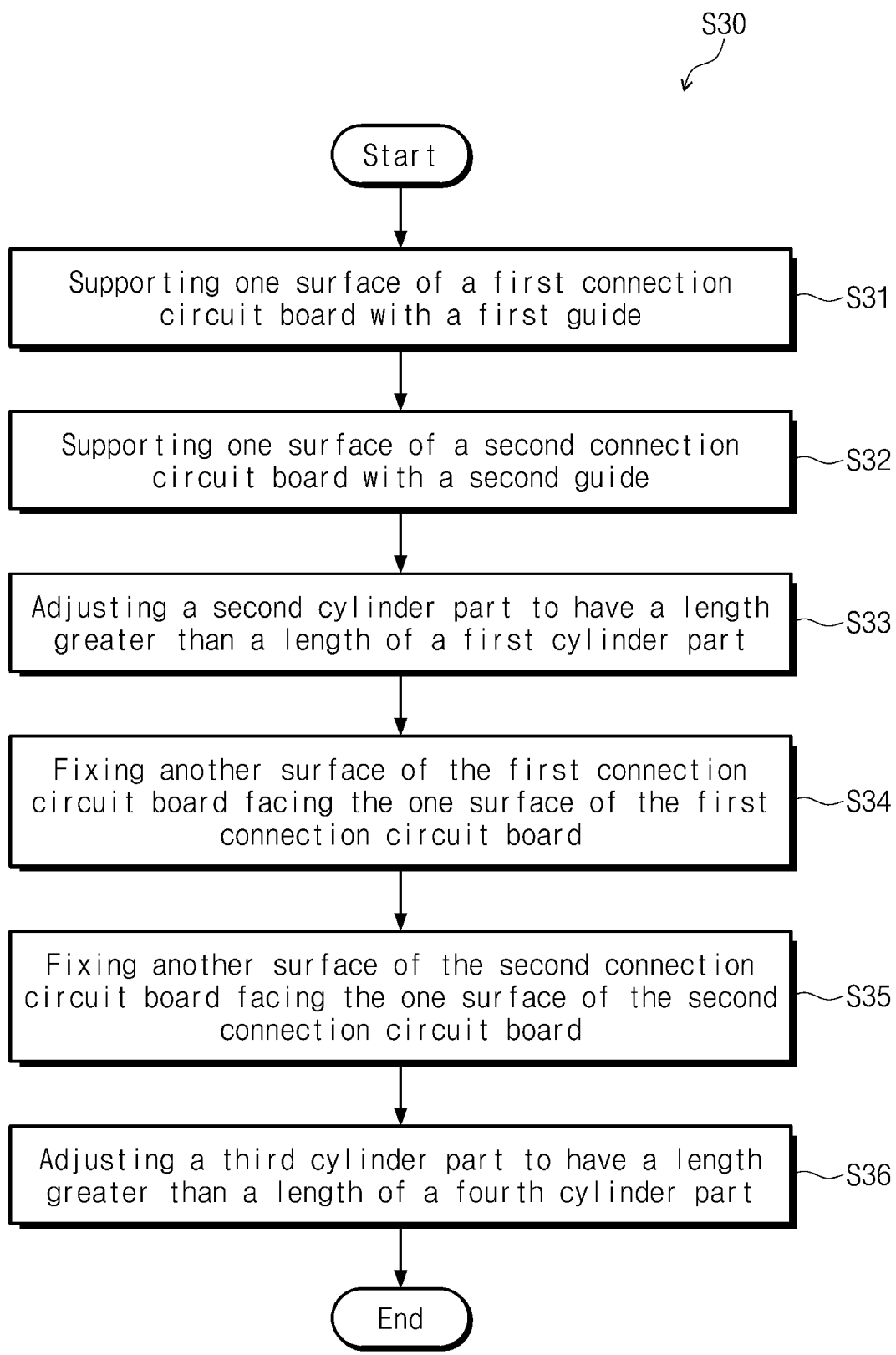
Figure 12C:
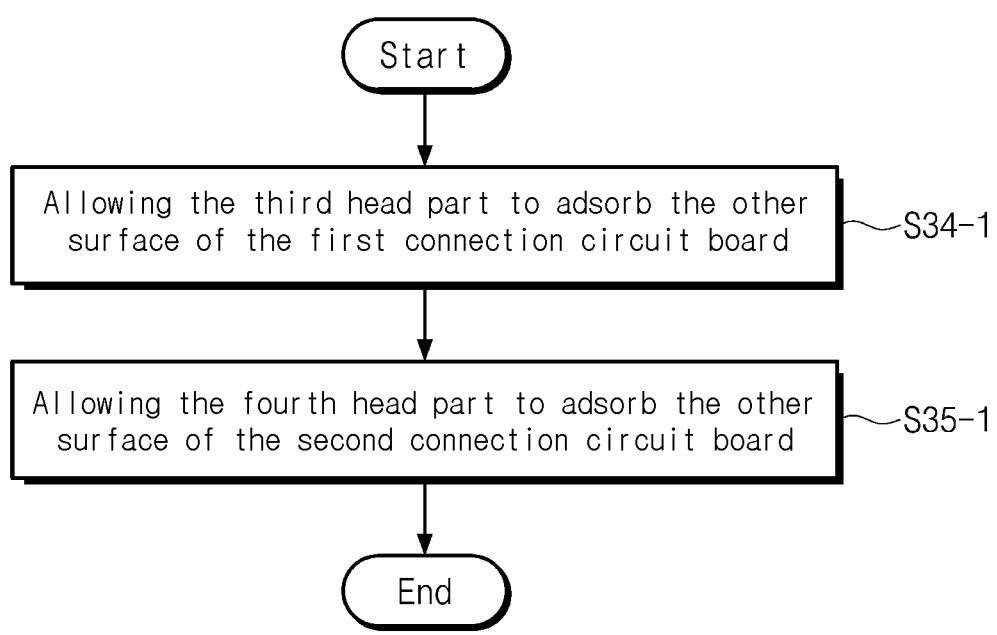

FIGS. 12A to 12C illustrate flow charts showing a display device fabricating method according to embodiments. In a display device fabricating method discussed below, steps are not performed in a specific sequence, but may be executed in different sequences. By way of example, one or more of the steps may be omitted.

Referring to FIG. 12A, a display device fabricating method S1 according to embodiments may include a step S10 in which the first jig JG1 is provided thereon with the display panel DP to which is attached one of the sides of the connection circuit boards FPCB1 and FPCB2, a step S20 in which the second jig JG2 is provided thereon with the main circuit board MPCB, a step S30 in which the connection circuit boards FPCB1 and FPCB2 are supported by the supporter SP disposed between the first jig JG1 and the second jig JG2, and a step S40 in which other sides of the connection circuit boards FPCB1 and FPCB2 are attached to the main circuit board MPCB.

Referring to FIG. 12B, the step S30 in which the first and second connection circuit boards FPCB1 and FPCB2 are supported by the supporter SP disposed between the first jig JG1 and the second jig JG2 may include a step S31 in which the first guide GD1 supports one surface of the first connection circuit board FPCB1, a step S32 in which the second guide GD2 supports one surface of the second connection circuit board FPCB2, and a step S33 in which the second cylinder part SY2 is adjusted to have a length greater or longer than that of the first cylinder part SY1. The step S30 in which the first and second connection circuit boards FPCB1 and FPCB2 are supported by the supporter SP disposed between the first jig JG1 and the second jig JG2 may include a step S34 in which the third guide GD3 fixes or supports the other surface of the first connection circuit board FPCB1 facing the one surface of the first connection circuit board FPCB1, a step S35 in which the fourth guide GD4 fixes or supports the other surface of the second connection circuit board FPCB2 facing the one surface of the second connection circuit board FPCB2, and a step S36 in which the third cylinder part SY3 is adjusted to have a length greater than that of the fourth cylinder part SY4.

Referring to FIG. 12C, the step S34 in which the third guide GD3 supports the other surface of the first connection circuit board FPCB1 facing the one surface of the first connection circuit board FPCB1 may be a step S34-1 in which the third head part HD3 adsorbs the other surface of the first connection circuit board FPCB1. The step S35 in which the fourth guide GD4 supports the other surface of the second connection circuit board FPCB2 facing the one surface of the second connection circuit board FPCB2 may be a step S35-1 in which the fourth head part HD4 adsorbs the other surface of the second connection circuit board FPCB2.

Figure 13:
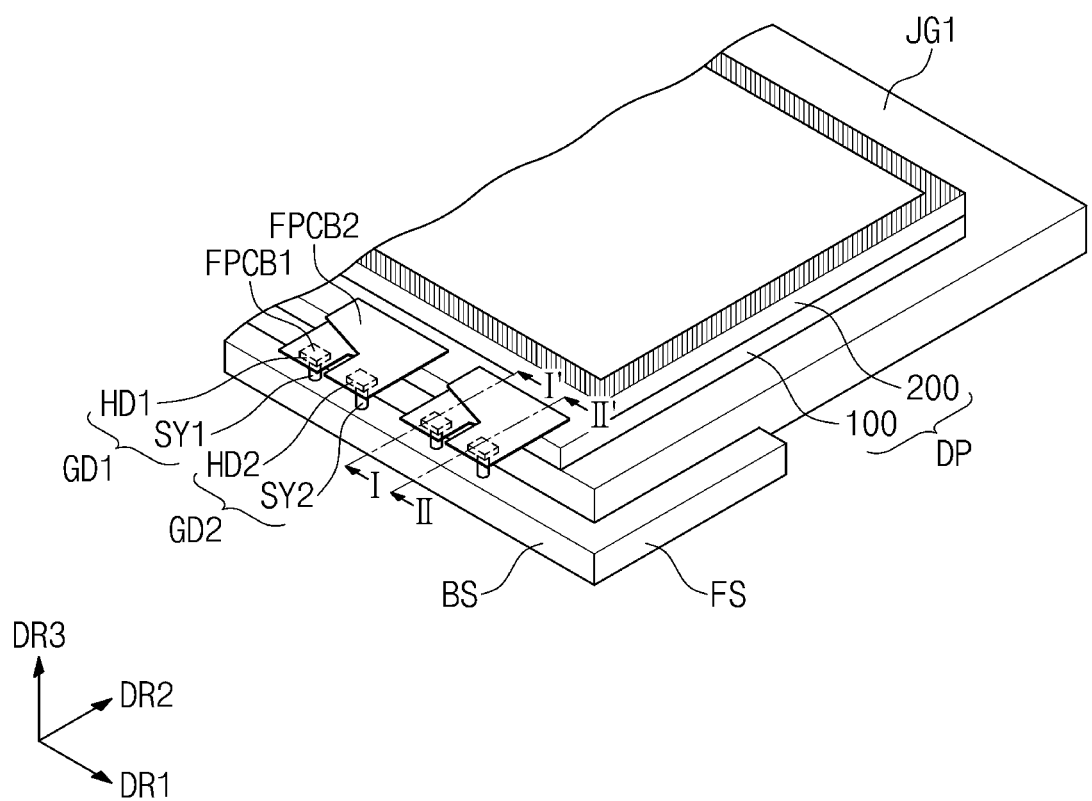
FIG. 13 illustrates a perspective view partially showing a first jig and a supporter according to embodiments.

FIG. 13 illustrates a perspective view partially showing a first jig and a supporter according to embodiments. FIGS. 14A to 14C, 15A, and 15B illustrate schematic cross-sectional views partially showing steps illustrated in FIGS. 12A and 12B.

Referring to FIG. 13, the first head part HD1 may support the first connection circuit board FPCB1, and the second head part HD2 may support the second connection circuit board FPCB2. The first head part HD1 may support a portion of the first connection circuit board FPCB1 that does not overlap the second connection circuit board FPCB2, and the second head part HD2 may support a portion of the second connection circuit board FPCB2 that does not overlap the first connection circuit board FPCB1. For example, the second part (see P2 of FIG. 6) of the first connection circuit board FPCB1 may have a portion that does not overlap the second connection circuit board FPCB2, and the first head part HD1 may support the portion of the second part P2 of the first connection circuit board FPCB1. The second part (see P2 of FIG. 6) of the second connection circuit board FPCB2 may have a portion that does not overlap the first connection circuit board FPCB1, and the second head part HD2 may support the portion of the second part P2 of the second connection circuit board FPCB2. The disclosure, however, may not be limited thereto. For example, the first head part HD1 may support a portion of the first connection circuit board FPCB1, which portion overlaps the second connection circuit board FPCB2.

Figure 14A:
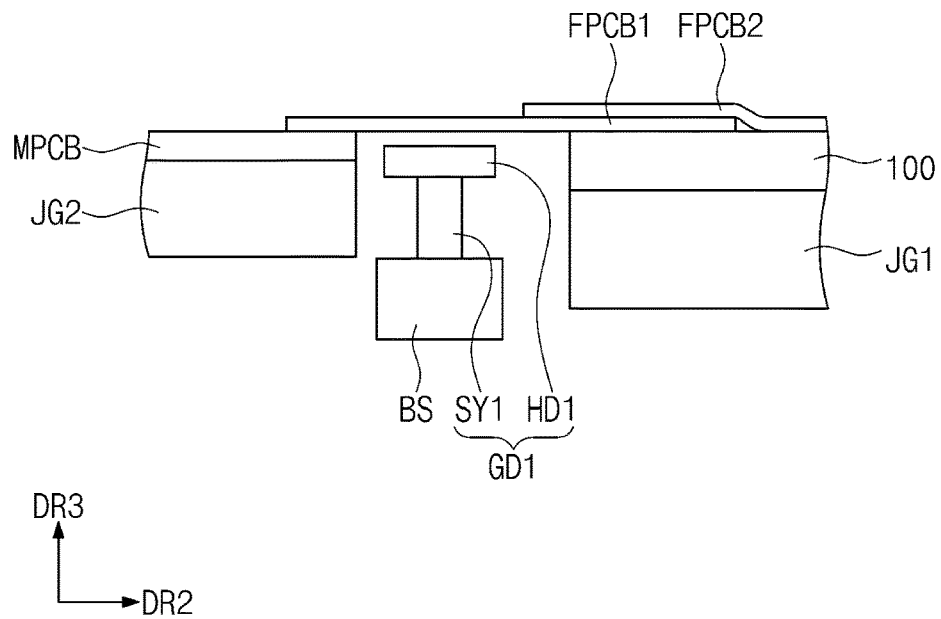
FIGS. 14A to 14C, 15A, and 15B illustrate schematic cross-sectional views partially showing steps illustrated in FIGS. 12A to 12C.
Figure 15A:
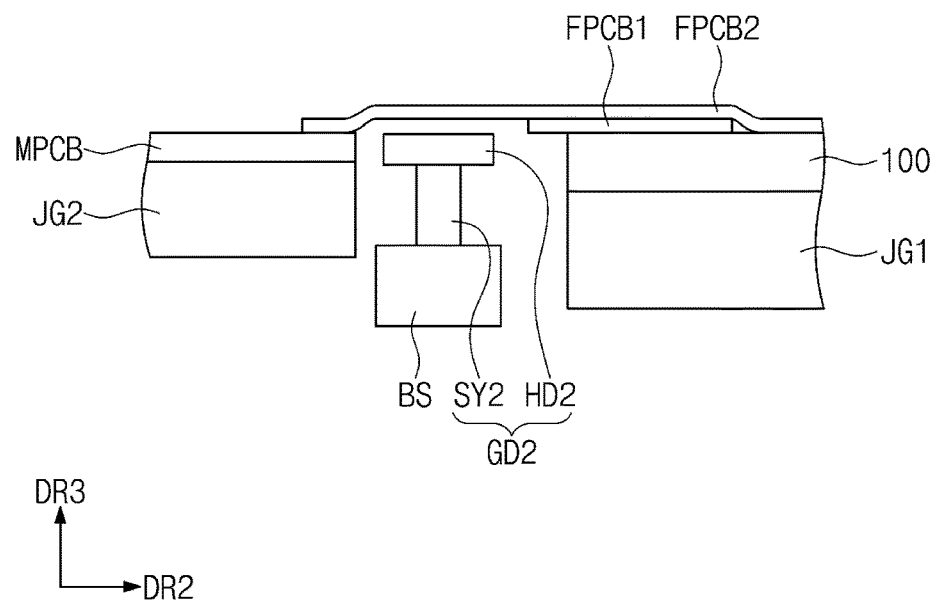

FIGS. 14A and 15A show configurations in which the display panel DP and the main circuit board MPCB are respectively disposed on the first jig JG1 and the second jig JG2. The display panel DP is disposed on the first jig JG1 through the step S10 in which the first jig JG1 is provided thereon with the display panel DP to which is attached one of the sides of the connection circuit boards FPCB1 and FPCB2. The main circuit board MPCB is disposed on the second jig JG2 through the step S20 in which the second jig JG2 is provided thereon with the main circuit board MPCB.

Of the step S30 shown in FIG. 12B, the steps S31, S32, and S33 are illustrated in FIGS. 14A to 14C, 15A, and 15B.

In other words, FIGS. 14A to 14C, 15A, and 15B show the step S31 in which the first guide GD1 supports one surface of the first connection circuit board FPCB1, the step S32 in which the second guide GD2 supports one surface of the second connection circuit board FPCB2, and the step S33 in which the second cylinder part SY2 is adjusted to have a length greater than that of the first cylinder part SY1.

Figure 14B:
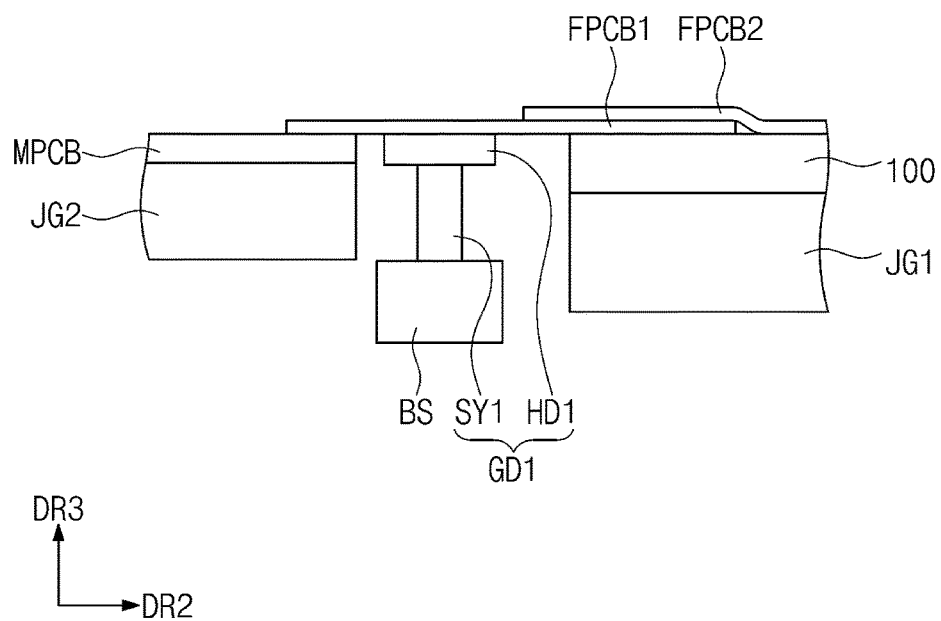
Figure 14C:
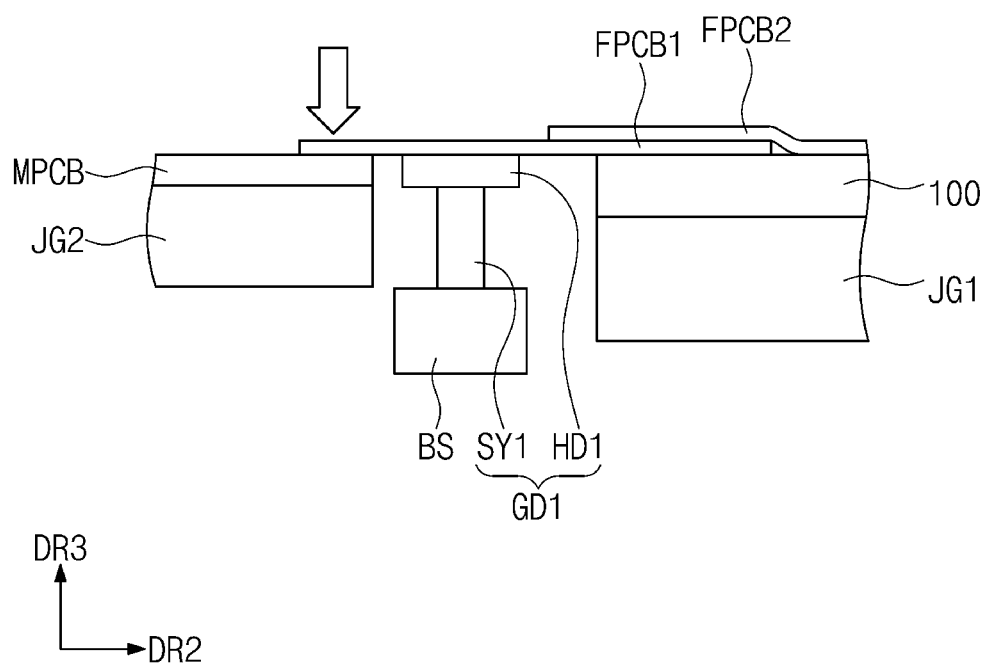
Figure 15B:
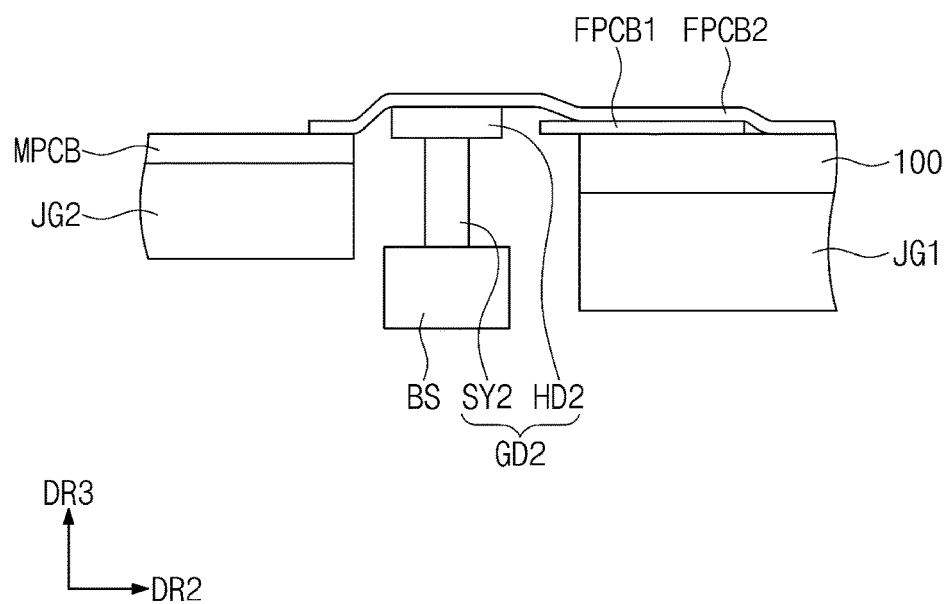

FIGS. 14A to 14C illustrate schematic cross-sectional views taken along line I-I' of FIG. 13. FIGS. 15A and 15B illustrate schematic cross-sectional views taken along line II-II' of FIG. 13. In FIG. 13, illustration of the second jig JG2 is omitted to clearly show the first jig JG1 and the supporter SP, but in FIGS. 14A to 14C, 15A, and 15B, schematic cross-sections of the second jig JG2 and the main circuit board MPCB are shown together for convenience of description.

Referring to FIGS. 14A, 14B, 15A, and 15B, the first cylinder parts SY1 of the first guides GD1 and the second cylinder parts SY2 of the second guides GD2 may extend in the third direction DR3 to support the first connection circuit board FPCB1 and the second connection circuit board FPCB2. For example, the first cylinder part SY1 may rise to a height not so high as to cause bending of the first connection circuit board FPCB1, supporting the first connection circuit board FPCB1. The second cylinder part SY2 may extend further in the third direction DR3 than the first cylinder part SY1. For example, the second cylinder part SY2 may extend further than the first cylinder part SY1, and the second connection circuit board FPCB2 may bend in the third direction DR3, or in an extending direction of the second cylinder part SY2.

It may be assumed that a single supporter simultaneously supports both the first connection circuit board FPCB1 and the second connection circuit board FPCB2. Accordingly, it is likely that the first connection circuit board FPCB1 may be compressed by the second connection circuit board FPCB2 in assembling the display device (see DD of FIG. 2) in a housing (not shown), and for example, the second connection circuit board FPCB2 may suffer from a localized reverse warpage. For example, the second connection circuit board FPCB2 may be partially bent downwardly, and may be damaged due to a locally applied force.

In the display device fabricating method S1 according to embodiments, the first guide GD1 and the second guide GD2 respectively support the first connection circuit board FPCB1 and the second connection circuit board FPCB2. Therefore, the second connection circuit board FPCB2 may be assembled to bend upwardly, and the first connection circuit board FPCB1 may not be compressed by the second connection circuit board FPCB2 when the display device DD is associated in a housing (not shown). As a result, the first connection circuit board FPCB1 may not undergo a localized reverse warpage, and the display device DD may increase in durability.

FIG. 14C shows the step S40 in which other sides of the first and second connection circuit boards FPCB1 and FPCB2 are attached to the main circuit board MPCB. Although not shown, adhesive members (not shown) may be disposed between the main circuit board MPCB and the first and second connection circuit boards FPCB1 and FPCB2. For example, the anisotropic conductive films (see ACF of FIG. 3) may be disposed between the main circuit board MPCB and the first and second connection circuit boards FPCB1 and FPCB2. While the guides GD1 and GD2 support the first connection circuit board FPCB1 and the second connection circuit board FPCB2, pressure and/or heat (designated by hollow arrow) may be applied to attach the first connection circuit board FPCB1 to the main circuit board MPCB.

Figure 16:
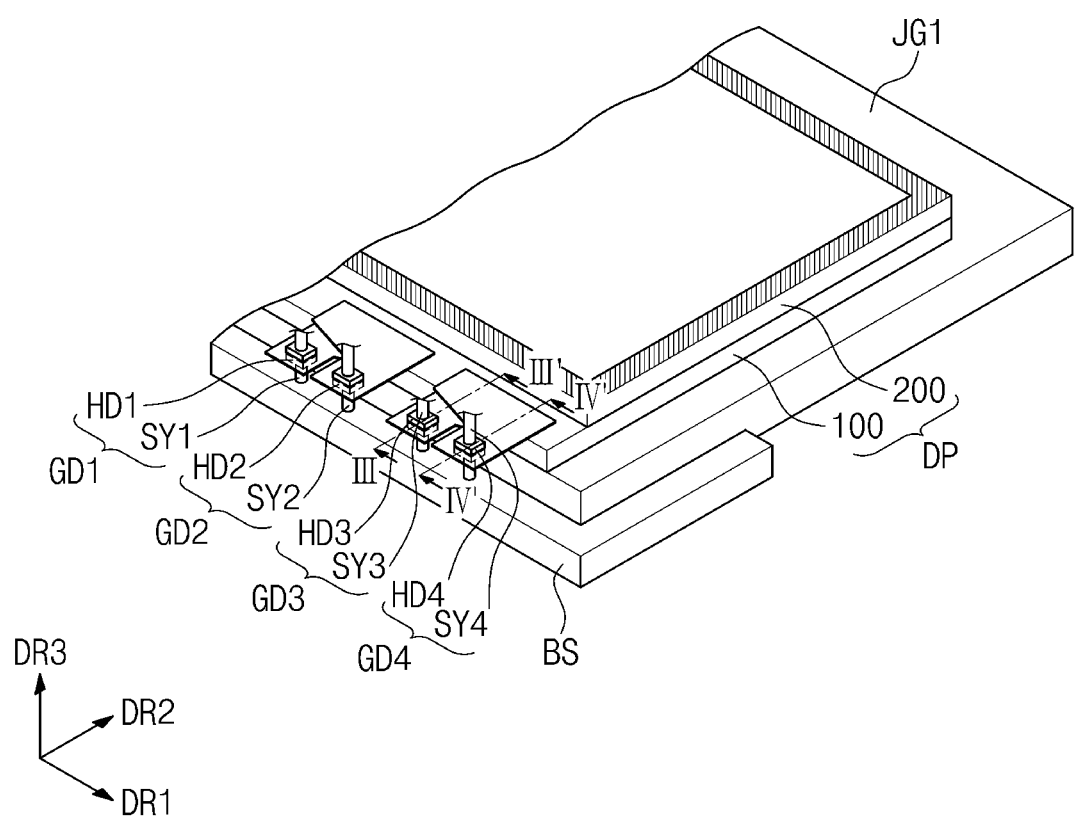
FIG. 16 illustrates a perspective view partially showing a first jig and a supporter according to embodiments.
Figure 17A:
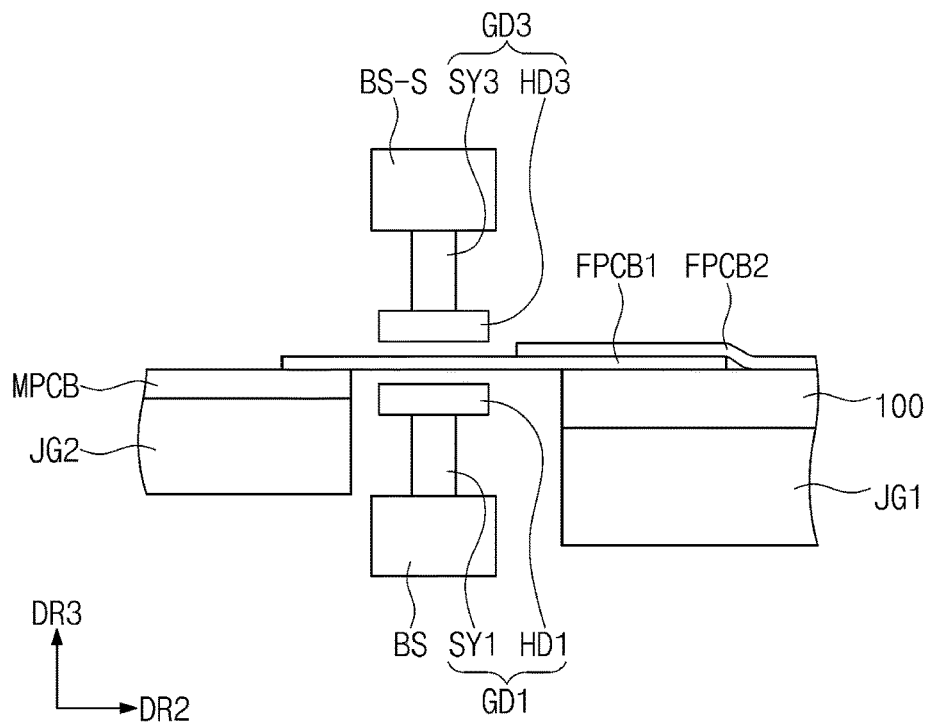
FIGS. 17A, 17B, 18A, and 18B illustrate schematic cross-sectional views showing steps illustrated in FIGS. 12A to 12C.
Figure 17B:
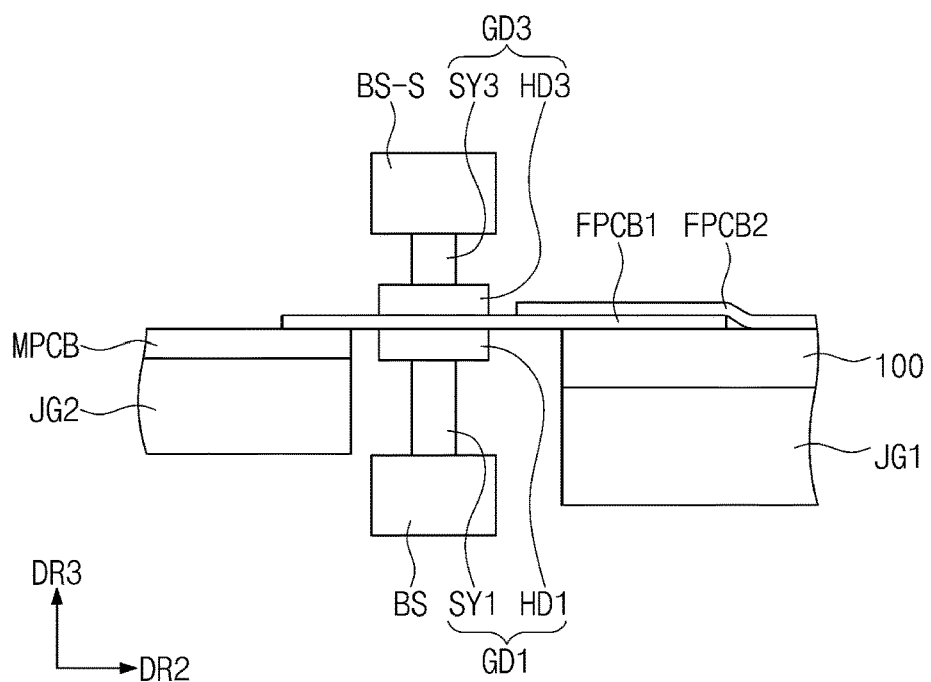
Figure 18A:
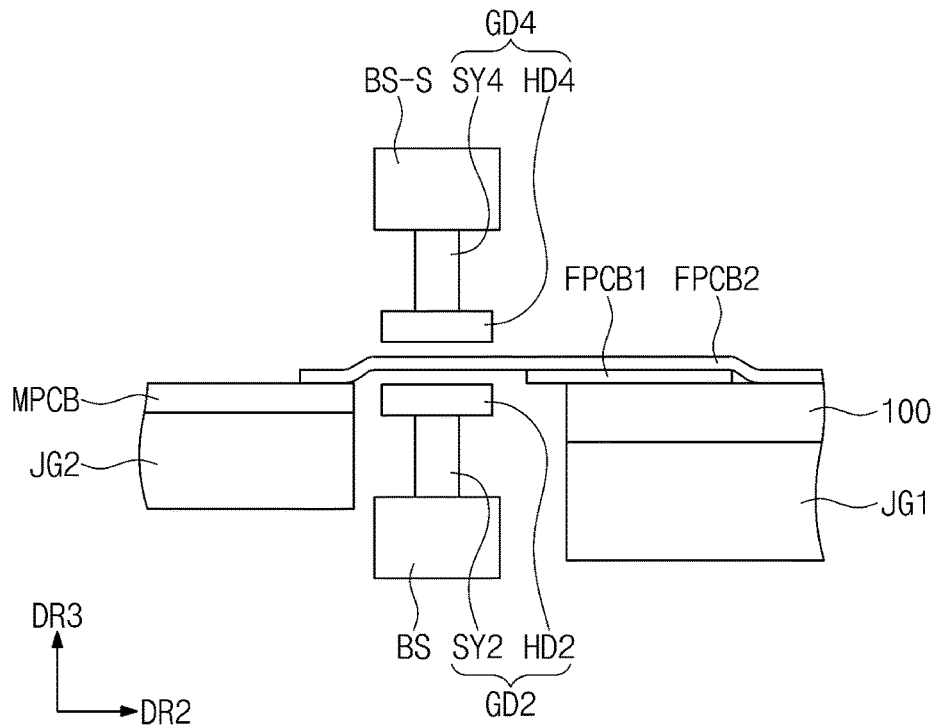
Figure 18B:
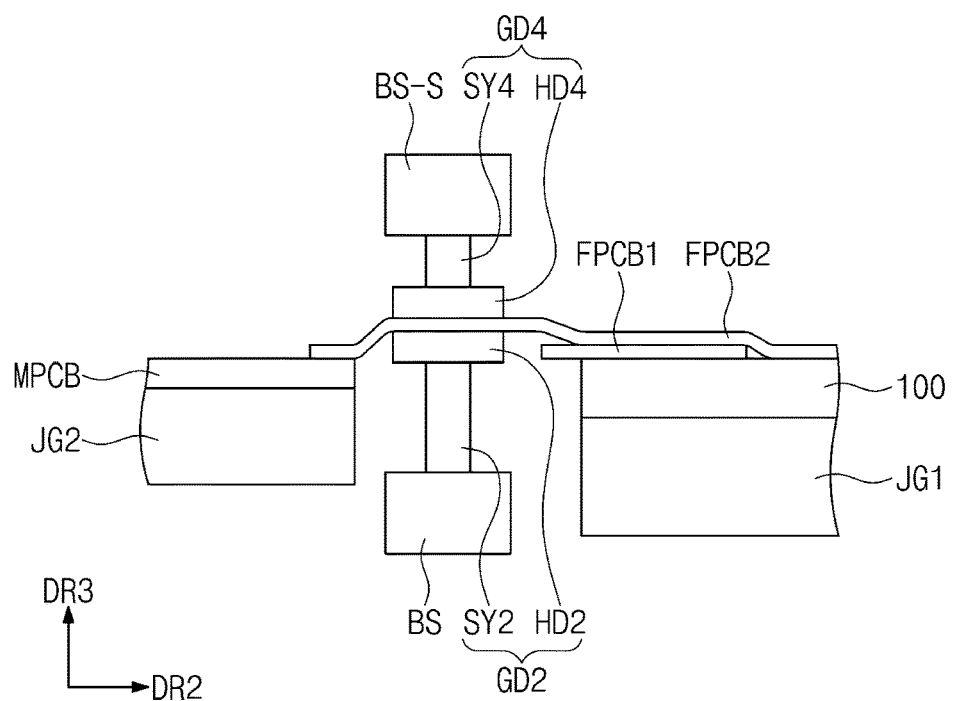

FIG. 16 illustrates a perspective view partially showing the first jig JG1 and the supporter SP-1 according to embodiments. FIGS. 17A, 17B, 18A, and 18B illustrate schematic cross-sectional views showing steps illustrated in FIGS. 12A to 12C.

In comparison with FIG. 13, FIG. 16 shows a configuration that includes the third guides GD3 supporting the other surface of the first connection circuit board FPCB1 facing the one surface of the first connection circuit board FPCB1, and that also includes the fourth guides GD4 supporting the other surface of the second connection circuit board FPCB2 facing the one surface of the second connection circuit board FPCB2. The third head part HD3 may fix the first connection circuit board FPCB1, and the fourth head part HD4 may fix the second connection circuit board FPCB2. The third and fourth head parts HD3 and HD4 may fix portions where the first and second connection circuit boards FPCB1 and FPCB2 do not overlap each other. For example, the second part (see P2 of FIG. 6) of the first connection circuit board FPCB1 may have a portion that does not overlap the second connection circuit board FPCB2, and the third head part HD3 may fix the portion of the second part P2 of the first connection circuit board FPCB1. The second part (see P2 of FIG. 6) of the second connection circuit board FPCB2 may have a portion that does not overlap the first connection circuit board FPCB1, and the fourth head part HD4 may fix the portion of the second part P2 of the second connection circuit board FPCB2. The disclosure, however, may not be limited thereto. For example, the fourth head part HD4 may fix a portion of the first connection circuit board FPCB1, which portion overlaps the second connection circuit board FPCB2.

In comparison with FIGS. 14A, 14B, 15A, and 15B, FIGS. 17A, 17B, 18A, and 18B illustrate the step S34 in which the third guide GD3 supports the other surface of the first connection circuit board FPCB1 facing the one surface of the first connection circuit board FPCB1, the step S35 in which the fourth guide GD4 supports the other surface of the second connection circuit board FPCB2 facing the one surface of the second connection circuit board FPCB2, and the step S36 in which the third cylinder part SY3 is adjusted to have a length greater than that of the fourth cylinder part SY4.

Referring to FIGS. 17A, 17B, 18A, and 18B, the third cylinder part SY3 may extend in a direction opposite to an extending direction of the first cylinder part SY1, supporting and fixing the first connection circuit board FPCB1. The fourth cylinder part SY4 may extend in a direction opposite to an extending direction of the second cylinder part SY2, supporting and fixing the second connection circuit board FPCB2. For example, the third cylinder part SY3 may extend further than the fourth cylinder part SY4. For example, an extending direction of the third cylinder part SY3 may be greater than that of the fourth cylinder part SY4. Therefore, the second connection circuit board FPCB2 supported by the second and fourth cylinder parts SY2 and SY4 may bend in the third direction DR3, or in an extending direction of the second cylinder part SY2. As a result, durability of the display device (see DD of FIG. 2) may improve for the same or similar reasons as that discussed with reference to FIGS. 14A, 14B, 15A, and 15B.

As shown in figures, the first connection circuit board FPCB1 may be supported by the third guides GD3 at their supporting positions that correspond to those at which the first guides GD1 support the first connection circuit board FPCB1. The second connection circuit board FPCB2 may be supported by the fourth guides GD4 at their supporting positions that correspond to those at which the second guides GD2 support the second connection circuit board FPCB2. Each of the first and second connection circuit boards FPCB1 and FPCB2 may be more rigidly supported by two guides than by a single guide. As an example, when each of the first and second connection circuit boards FPCB1 and FPCB2 is supported by a single guide, each of the connection circuit boards FPCB1 and FPCB2 may be bent at its portion that is not supported by the single guide. In contrast, when each of the first and second connection circuit boards FPCB1 and FPCB2 is supported by two guides, each of the first and second connection circuit boards FPCB1 and FPCB2 may be more rigidly supported and thus may be prevented from being bent at its portion that is not supported by the guide. Accordingly, it may be possible to improve durability of the display device DD manufactured by the display device fabricating method (see S1 of FIG. 12A) according to embodiments.

Because the display device assembling apparatus EQ includes the guides GD1 and GD2 whose lengths are adjusted in a substantially up-and-down direction, the display device (see DD of FIG. 2) may be fabricated to have improved durability.

A display device manufactured by a display device fabricating method using a display device assembling apparatus according to embodiments may be assembled in such a way that a second connection circuit board, which is disposed on a first connection circuit board, bends in extending directions of first and second cylinder parts. Therefore, it may be unlikely that the first connection circuit board is compressed by the second connection circuit board. As a result, it may be possible to improve durability of the display device manufactured by the display device fabricating method using the display device assembling apparatus.

The display device assembling apparatus according to embodiments may support a connection circuit board during a process for assembling a display device, and thus the display device may be fabricated to have improved durability.

High durability may be provided to the display device manufactured by the display device fabricating method according to embodiments.

While the disclosure has been illustrated and described with reference to the embodiments thereof, it will be apparent to those of ordinary skill in the art that various changes in form and detail may be formed thereto without departing from the spirit and scope of the disclosure.

What is claimed is:

1. A method of fabricating a display device, the method comprising:
   providing on a first jig a display panel to which is attached one side of a connection circuit board;
   providing a main circuit board on a second jig;
   supporting the connection circuit board with a supporter between the first jig and the second jig; and
   attaching another side of the connection circuit board to the main circuit board,
   wherein the supporter includes a base part and a plurality of guides on the base part, the guides being adjusted in length in an up-and-down direction.

2. The method of claim 1, wherein
the plurality of guides are spaced apart from each other.

3. The method of claim 1, wherein
the connection circuit board includes a first connection circuit board and a second connection circuit board on the first connection circuit board,
the plurality of guides include a first guide and a second guide, and
supporting the connection circuit board with the supporter includes:
   supporting one surface of the first connection circuit board with the first guide; and
   supporting one surface of the second connection circuit board with the second connection circuit board.

4. The method of claim 3, wherein
the first guide includes:
   a first head part on the base part; and
   a first cylinder part disposed between the base part and the first head part and that is adjusted in length in the up-and-down direction, and
the second guide includes:
   a second head part on the base part; and
   a second cylinder part disposed between the base part and the second head part and that is adjusted in length in the up-and-down direction.

5. The method of claim 4, wherein the second cylinder part is adjusted to have a length greater than a length of the first cylinder part.

6. The method of claim 4, wherein the second cylinder part is adjusted to have a length longer than a length of the first cylinder part.

7. The method of claim 6, further comprising:
the second connection circuit board bends in an extending direction of the second cylinder part.

8. The method of claim 4, wherein
the supporter further includes:
   a subsidiary base part that faces the base part;
   a connection part that connects the base part to the subsidiary base part;
   a third guide disposed on the subsidiary base part and that supports another surface of the first connection circuit board, the other surface of the first connection circuit board facing the one surface of the first connection circuit board; and
   a fourth guide disposed on the subsidiary base part and that supports an other surface of the second connection circuit board, the other surface of the second connection circuit board facing the one surface of the second connection circuit board, and
supporting the connection circuit board with the supporter further includes:
   fixing the other surface of the first connection circuit board with the third guide; and
   fixing the other surface of the second connection circuit board with the fourth guide.

9. The method of claim 8, wherein
the third guide includes:
   a third head part on the subsidiary base part; and
   a third cylinder part disposed between the subsidiary base part and the third head part and that is adjusted in length in the up-and-down direction,
the fourth guide includes:
   a fourth head part on the subsidiary base part; and
   a fourth cylinder part disposed between the subsidiary base part and the fourth head part and that is adjusted in length in the up-and-down direction, and
supporting the connecting circuit board with the supporter further includes adjusting the third cylinder part to have a length greater than a length of the fourth cylinder part.

10. The method of claim 9, wherein
each of the third and fourth head parts includes forming an adsorbing segment,
supporting the connection circuit board with the supporter further includes:
- allowing the adsorbing segment of the third head part to adsorb the other surface of the first connection circuit board; and
- allowing the adsorbing segment of the fourth head part to adsorb the other surface of the second connection circuit board.

* * * * *